US009070796B2

(12) United States Patent
Sakaguchi

(10) Patent No.: US 9,070,796 B2
(45) Date of Patent: Jun. 30, 2015

(54) SOLID-STATE IMAGING DEVICE AND IMAGING APPARATUS

(71) Applicant: OLYMPUS CORPORATION, Tokyo (JP)

(72) Inventor: Naofumi Sakaguchi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 205 days.

(21) Appl. No.: 13/693,119

(22) Filed: Dec. 4, 2012

(65) Prior Publication Data
US 2013/0087877 A1 Apr. 11, 2013

(30) Foreign Application Priority Data

Jul. 6, 2011 (JP) ................................. 2011-150081

(51) Int. Cl.
H01L 21/02 (2006.01)
H01L 31/02 (2006.01)
H01L 27/146 (2006.01)

(52) U.S. Cl.
CPC .... *H01L 31/02016* (2013.01); *H01L 27/14603* (2013.01); *H01L 27/14636* (2013.01); *H01L 27/14641* (2013.01)

(58) Field of Classification Search
CPC ............ H01L 27/1463; H01L 27/1464; H01L 27/14601; H01L 27/14609; H01L 27/14612; H01L 27/14634; H01L 27/14643; H01L 27/14645
USPC ...................................................... 257/59, 72
See application file for complete search history.

(56) References Cited

U.S. PATENT DOCUMENTS

| 4,500,915 | A | 2/1985 | Koike et al. |
| 4,910,588 | A | 3/1990 | Kinoshita et al. |
| 6,518,910 | B2* | 2/2003 | Sakuragi et al. ............. 341/162 |
| 7,982,789 | B2 | 7/2011 | Watanabe et al. |
| 8,508,639 | B2 | 8/2013 | Mabuchi et al. |
| 2003/0010896 | A1* | 1/2003 | Kaifu et al. ................ 250/208.1 |
| 2005/0253945 | A1* | 11/2005 | Shinohara .................... 348/300 |
| 2011/0019053 | A1* | 1/2011 | Nishihara .................... 348/311 |
| 2013/0161487 | A1* | 6/2013 | Sakaguchi et al. ......... 250/208.1 |

(Continued)

FOREIGN PATENT DOCUMENTS

| JP | 2001-024948 A | 1/2001 |
| JP | 2002-344809 A | 11/2002 |
| JP | 2003-259227 A | 9/2003 |

(Continued)

OTHER PUBLICATIONS

US Office Action dated Feb. 25, 2015, issued in related U.S. Appl. No. 13/707,181 (24 pages).

(Continued)

*Primary Examiner* — Michael Lebentritt
(74) *Attorney, Agent, or Firm* — Westerman, Hattori, Daniels & Adrian, LLP

(57) ABSTRACT

A solid-state imaging device generates signals by photoelectric conversion elements included in a first substrate in which circuit elements of a plurality of pixels are arranged. The solid-state imaging device outputs, from the plurality of pixels via output circuits, the signals that are generated by the photoelectric conversion elements and are via connection parts that electrically connect the first substrate with a second substrate, the output circuits being included in the second substrate.

19 Claims, 12 Drawing Sheets

(56) References Cited

U.S. PATENT DOCUMENTS

| | | | |
|---|---|---|---|
| 2014/0016006 A1* | 1/2014 | Tashiro et al. | 348/281 |
| 2014/0176770 A1* | 6/2014 | Kondo | 348/294 |

FOREIGN PATENT DOCUMENTS

| | | | |
|---|---|---|---|
| JP | 2006-049361 A | 2/2006 | |
| JP | 2010-219339 A | 9/2010 | |
| JP | 2011-091400 A | 5/2011 | |

OTHER PUBLICATIONS

Japanese Office Action dated May 7, 2015, issued in corresponding JP Patent Application No. 2011-150081 with English translation (10 pages).

* cited by examiner

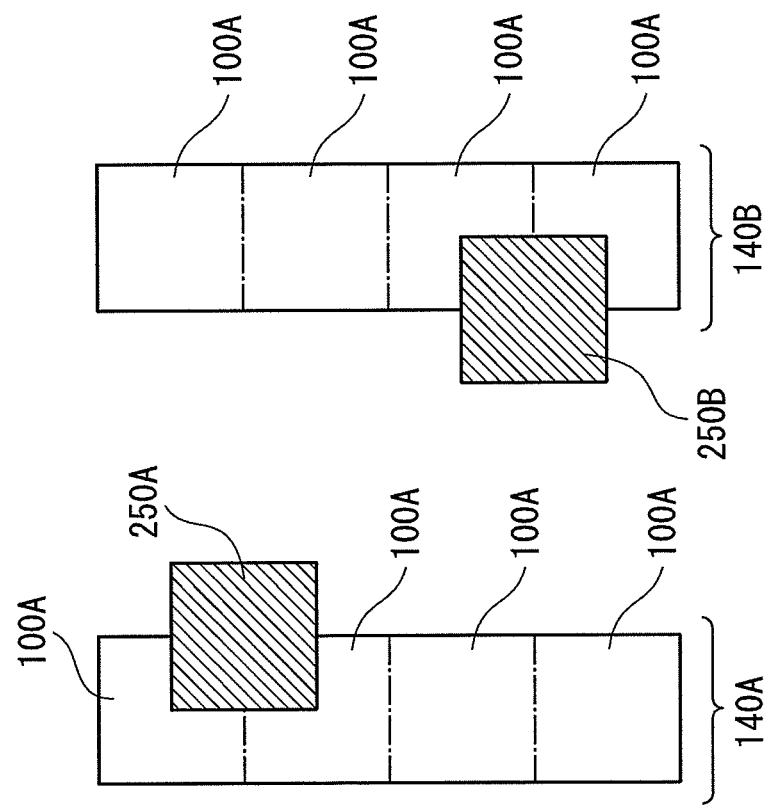
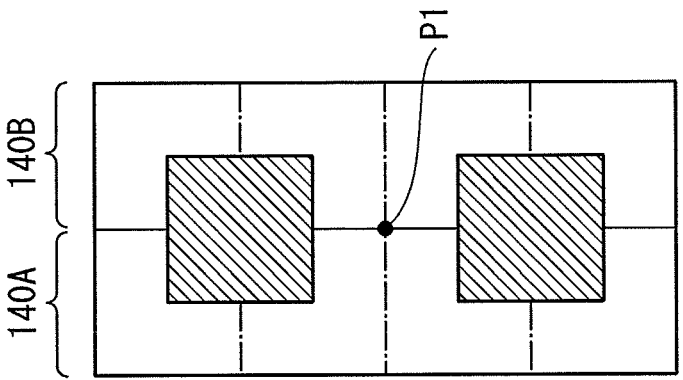

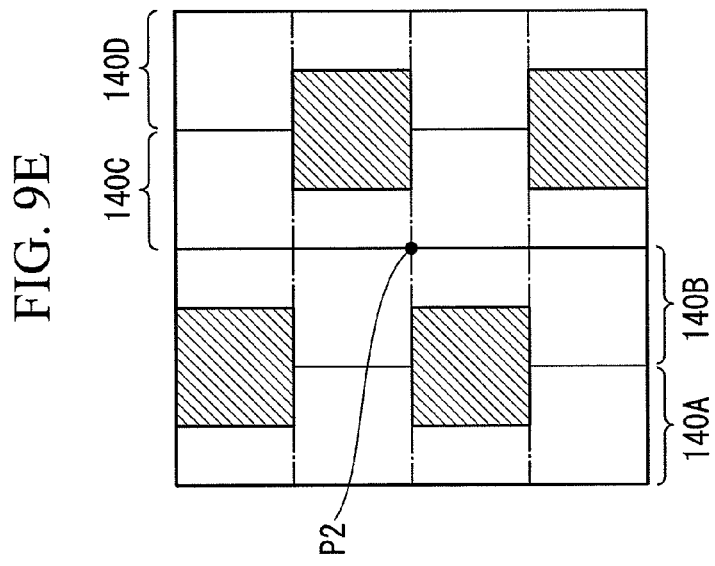
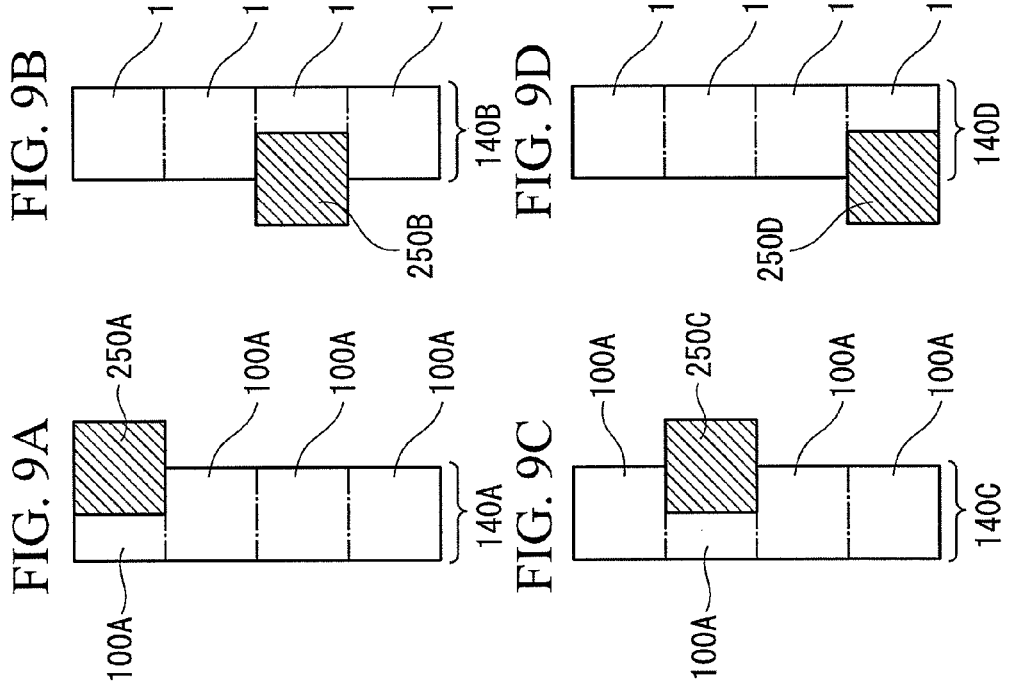

SOLID-STATE IMAGING DEVICE AND IMAGING APPARATUS

BACKGROUND OF THE INVENTION

1. Field of the Invention

The present invention relates to a solid-state imaging device and an imaging apparatus in which a first substrate and a second substrate in which circuit elements of pixels are arranged are electrically connected. Further, the present invention relates to a signal reading method of reading signals from pixels.

2. Description of Related Art

In recent years, video cameras, electronic still cameras, and the like have been widely popularized. A CCD (Charge Coupled Device)-type or amplification-type solid-state imaging device is used for such a camera. The amplification-type solid-state imaging device guides signal charges generated and accumulated by a photoelectric conversion unit of a pixel on which light is incident to an amplification unit in the pixel, and outputs the signal amplified by the amplification unit from the pixel. In the amplification-type solid-state imaging device, a plurality of pixels are arranged in a two-dimensional matrix shape. An example of the amplification-type solid-state imaging device includes a CMOS-type solid-state imaging device using a CMOS (Complementary Metal Oxide Semiconductor) transistor.

In related art, a general CMOS-type solid-state imaging device adopts a scheme of sequentially reading, for each row, signal charges generated by photoelectric conversion units of the respective pixels arranged in a two-dimensional matrix shape. In this scheme, since a timing of exposure in the photoelectric conversion unit of each pixel is determined by start and end of reading of signal charges, the exposure timing differs for each row.

A simultaneous imaging function (a global shutter function) of realizing simultaneity of accumulation of signal charges has been proposed. Further, uses of a CMOS-type solid-state imaging device having the global shutter function are increasing. In the CMOS-type solid-state imaging device having the global shutter function, generally, it is necessary to have an accumulation capacitor unit with a light shielding property in order to accumulate signal charges generated by a photoelectric conversion unit until reading is performed. In this CMOS-type solid-state imaging device, after all pixels are simultaneously exposed, signal charges generated by the respective photoelectric conversion units are simultaneously transferred from all of the pixels to respective accumulation capacitor units and temporarily accumulated in the accumulation capacitor units. Also, the signal charges are sequentially converted into pixel signals and read at a predetermined reading timing.

A solid-state imaging device is disclosed in Japanese Patent Application Laid-Open Publication No. 2006-49361. In this solid-state imaging device, a MOS image sensor chip and a signal processing chip are connected by a micro-bump. In the MOS image sensor chip, a micro-pad is formed in a wiring layer for each unit cell. In the signal processing chip, a micro-pad is formed in a wiring layer in a position corresponding to the micro-pad of the MOS image sensor chip.

A method of preventing increase in a chip area using a solid-state imaging device in which a first substrate in which photoelectric conversion units are formed and a second substrate in which a plurality of MOS transistors are formed are bonded is disclosed in Japanese Patent Application Laid-Open Publication No. 2010-219339.

FIG. 11A illustrates a cross-sectional configuration of a solid-state imaging device in which two substrates described above are bonded. A first substrate 90 and a second substrate 91 are electrically connected by a connection part 900 including micro-pads and micro-bumps. FIG. 11B illustrates a plan configuration of the first substrate 90 of the solid-state imaging device. Pixels 910 are arranged in a two-dimensional matrix shape in the first substrate 90.

Plating or the like is used for fabrication of the micro-bumps in the connection part for connecting the two substrates. A pitch of a micro-bump that can be fabricated using current technology is about 10 µm.

In a solid-state imaging device having a small pixel pitch, it is necessary to share some circuits by a plurality of pixels and provide one connection part in each pixel cell including the plurality of pixels in order to facilitate fabrication of the micro-bump. For example, when the pixel cell includes two pixels in a horizontal direction (a row direction) and two pixels in a vertical direction (a column direction), i.e., a total of four pixels, the pitch of the connection part is twice the pixel pitch in both the horizontal direction and the vertical direction. Accordingly, a clearance (a distance) between the connection parts can be secured. Accordingly, the connection part can be fabricated even when the pixel pitch is small. As the circuits are shared by the plurality of pixels as described above, the clearance between the connection parts can be secured.

In general, a solid-state imaging device is configured so that exposure of pixels or reading of signals is performed for each row, and a signal line that transfers a control signal for control of the exposure or the reading is arranged in each row.

When a pixel cell includes a plurality of pixels arranged in a horizontal direction, it is necessary to perform the control at a different timing for each pixel within the pixel cell. Accordingly, it is necessary to arrange signal lines for supplying a control signal to pixels in different column positions of the same row at different timings, in the respective pixels of the pixel cell, and the number of signal lines for the same row increases. Accordingly, it is desirable for the pixel cell to include a plurality of pixels arranged in a vertical direction. When the pixel cell includes the plurality of pixels arranged in the vertical direction, pixels in different column positions of the same row belong to different pixel cells, and the pixels in the different column positions of the same row can be controlled at the same timing. Accordingly, the control signal can be supplied to the pixels in the different column positions of the same row using the same signal line.

When the pixel cell includes the plurality of pixels arranged in the vertical direction, a clearance in the vertical direction between connection parts can be secured.

FIG. 12 schematically illustrates an example in which a pixel cell includes four pixels arranged in a vertical direction.

FIG. 12 illustrates a state in which pixels are viewed from a direction perpendicular to a surface of a pixel array in which pixels are arranged. A pixel cell 920A includes four pixels 910, and a connection part 900A is arranged in a center position of the pixel cell 920A. A pixel cell 920B includes four pixels 910, and a connection part 900B is arranged in a center position of the pixel cell 920B. When the pixel cells are configured as illustrated in FIG. 12, clearances in the vertical direction between connection parts in pixel cells adjacent in a vertical direction to the pixel cells 920A and 920B and the connection parts 900A and 900B of the pixel cells 920A and 920B are secured.

SUMMARY OF THE INVENTION

A first aspect of the present invention is a solid-state imaging device comprising: a plurality of pixels; a first substrate and a second substrate in which circuit elements of the plurality of pixels are arranged, and connection parts that electrically connect the first substrate with the second substrate, wherein each of the plurality of pixels includes: a photoelectric conversion element included in the first substrate; and an output circuit that outputs, from the pixel, a signal that is generated by the photoelectric conversion element and is via the connection part, the output circuit being included in the second substrate, and wherein, in the first substrate, a region in which the plurality of pixels are arranged includes a plurality of pixel cells each including a plurality of pixels, and the connection parts are provided to correspond to the pixel cells, and a first connection region connected with the connection part corresponding to any one of the plurality of pixel cells is in a position according to a position of a second connection region connected with the connection part corresponding to the other pixel cell.

A second aspect of the present invention is the solid-state imaging device according to the first aspect of the present invention, wherein: the first connection region connected with the connection part corresponding to any one of the plurality of pixel cells is in a position according to the position of the second connection region connected with the connection part corresponding to the other pixel cell adjacent to any one of the plurality of pixel cells.

A third aspect of the present invention is the solid-state imaging device according to the second aspect of the present invention, wherein the first connection region and the second connection region are across any one of the plurality of pixel cells and the other pixel cell adjacent to the pixel cell.

A fourth aspect of the present invention is the solid-state imaging device according to the first aspect of the present invention, wherein the plurality of pixel cells include n pixels (n is an integer equal to or greater than 2) adjacent in a vertical direction or a horizontal direction within a surface in which the plurality of pixels are arranged.

A fifth aspect of the present invention is the solid-state imaging device according to the first aspect of the present invention, wherein distances between the connection regions within a unit including n pixel cells (n is an integer equal to or greater than 2) among the plurality of pixel cells are equal distances.

A sixth aspect of the present invention is the solid-state imaging device according to the fifth aspect of the present invention, wherein distances between the connection regions adjacent in a predetermined direction within the unit are equal distances.

A seventh aspect of the present invention is the solid-state imaging device according to the fifth aspect of the present invention, wherein the unit includes the plurality of n pixel cells continuously arranged in a predetermined direction.

An eighth aspect of the present invention is the solid-state imaging device according to the fifth aspect of the present invention, wherein the unit includes two of the plurality of pixel cells.

A ninth aspect of the present invention is the solid-state imaging device according to the fifth aspect of the present invention, wherein the unit includes four of the plurality of pixel cells.

A tenth aspect of the present invention is the solid-state imaging device according to the fifth aspect of the present invention, wherein: the plurality of pixels are arranged in a matrix shape, the pixel cell includes the plurality of pixels continuous in a vertical direction or a horizontal direction within a surface in which the plurality of pixels are arranged, and the unit has a rectangular shape.

An eleventh aspect of the present invention is the solid-state imaging device according to the first aspect of the present invention, wherein: each of the plurality of pixels further includes a signal accumulation circuit that accumulates a signal that is generated by the photoelectric conversion element and is via the connection part, the signal accumulation circuit being included in the second substrate, and the output circuit outputs, from the plurality of pixels, the signals accumulated in the signal accumulation circuits.

A twelfth aspect of the present invention is the solid-state imaging device according to the eleventh aspect of the present invention, wherein: all of the plurality of pixels are classified into a plurality of groups in units of a single row or a plurality of rows in an array of the plurality of pixels, and the device further includes a control circuit that performs control to collectively select the plurality of groups, sequentially accumulate signals generated by the photoelectric conversion elements of the plurality of pixels in the selected groups in the signal accumulation circuits, sequentially select any one group from the plurality of groups, and sequentially output signals accumulated in the signal accumulation circuits corresponding to the plurality of pixels in the selected group, from the plurality of pixels via the output circuits.

A thirteenth aspect of the present invention is the solid-state imaging device according to the eleventh aspect of the present invention, wherein: the plurality of pixels further include an amplification circuit that amplifies a signal generated by the photoelectric conversion element and outputs an amplification signal, and the signal accumulation circuit accumulates the amplification signal output from the amplification circuit.

A fourteenth aspect of the present invention is the solid-state imaging device according to the thirteenth aspect of the present invention, further including: a noise reduction circuit that reduces a noise in the amplification signal output from the amplification circuit, wherein the signal accumulation circuit accumulates the amplification signal in which the noise has been reduced by the noise reduction circuit.

A fifteenth aspect of the present invention is the solid-state imaging device according to the fourteenth aspect of the present invention, wherein the amplification circuit includes an amplification transistor that receives the signal generated by the photoelectric conversion element using a gate, amplifies the signal received using the gate, and outputs the amplification signal from one of a source and a drain.

A sixteenth aspect of the present invention is the solid-state imaging device according to the fifteenth aspect of the present invention, wherein the noise reduction circuit includes: a clamp capacitor that clamps the amplification signal output from the amplification transistor; and a transistor that receives a signal according to the amplification signal clamped by the clamp capacitor using one of a source and a drain, samples and holds the signal received using the one of the source and drain, and accumulates the resultant signal in the signal accumulation circuit.

A seventeenth aspect of the present invention is the solid-state imaging device according to the sixteenth aspect of the present invention, further including: a transfer circuit that transfers the signal generated by the photoelectric conversion element to an input part of the amplification circuit, wherein the connection part is arranged between the transfer circuit and the amplification transistor, between the amplification transistor and the clamp capacitor, or between the clamp capacitor and the transistor in an electrically connected path from the transfer circuit to the transistor.

An eighteenth aspect of the present invention is the solid-state imaging device according to the first aspect of the present invention, wherein the second substrate is connected with a surface opposite to a surface of the first substrate irradiated with light incident on the photoelectric conversion element.

A nineteenth aspect of the present invention is the imaging apparatus including: a plurality of pixels; a first substrate and a second substrate in which circuit elements of the plurality of pixels are arranged, and connection parts that electrically connect the first substrate with the second substrate, wherein each of the plurality of pixels includes: a photoelectric conversion element included in the first substrate; and an output circuit that outputs, from the pixel, a signal that is generated by the photoelectric conversion element and is via the connection part, the output circuit being included in the second substrate, and wherein, in the first substrate, a region in which the plurality of pixels are arranged includes a plurality of pixel cells each including a plurality of pixels, and the connection parts are provided to correspond to the pixel cells, and a first connection region connected with the connection part corresponding to any one of the plurality of pixel cells is in a position according to a position of a second connection region connected with the connection part corresponding to the other pixel cell.

BRIEF DESCRIPTION OF THE DRAWINGS

FIG. 8A is a first schematic diagram illustrating an arrangement of the connection part included in the solid-state imaging device according to the first embodiment of the present invention;

FIG. 8B is a second schematic diagram illustrating an arrangement of the connection part included in the solid-state imaging device according to the first embodiment of the present invention;

FIG. 8C is a third schematic diagram illustrating an arrangement of the connection part included in the solid-state imaging device according to the first embodiment of the present invention;

FIG. 9A is a first schematic diagram illustrating an arrangement of a connection part included in a solid-state imaging device according to a second embodiment of the present invention;

FIG. 9B is a second schematic diagram illustrating an arrangement of the connection part included in the solid-state imaging device according to the second embodiment of the present invention;

FIG. 9C is a third schematic diagram illustrating an arrangement of the connection part included in the solid-state imaging device according to the second embodiment of the present invention;

FIG. 9D is a fourth schematic diagram illustrating an arrangement of the connection part included in the solid-state imaging device according to the second embodiment of the present invention;

FIG. 9E is a fifth schematic diagram illustrating an arrangement of the connection part included in the solid-state imaging device according to the second embodiment of the present invention;

DETAILED DESCRIPTION OF THE INVENTION

Hereinafter, embodiments of the present invention will be described with reference to the drawings. The following description includes specific detailed contents as an example. However, those skilled in the art should, of course, understand that the detailed contents may be varied or modified and the variations and modifications of the contents are within the scope of the present invention. Accordingly, various exemplary embodiments to be described below will be described without loss of generality of the present invention described in the claims and without limitation on the present invention.

First Embodiment

Figure 1:
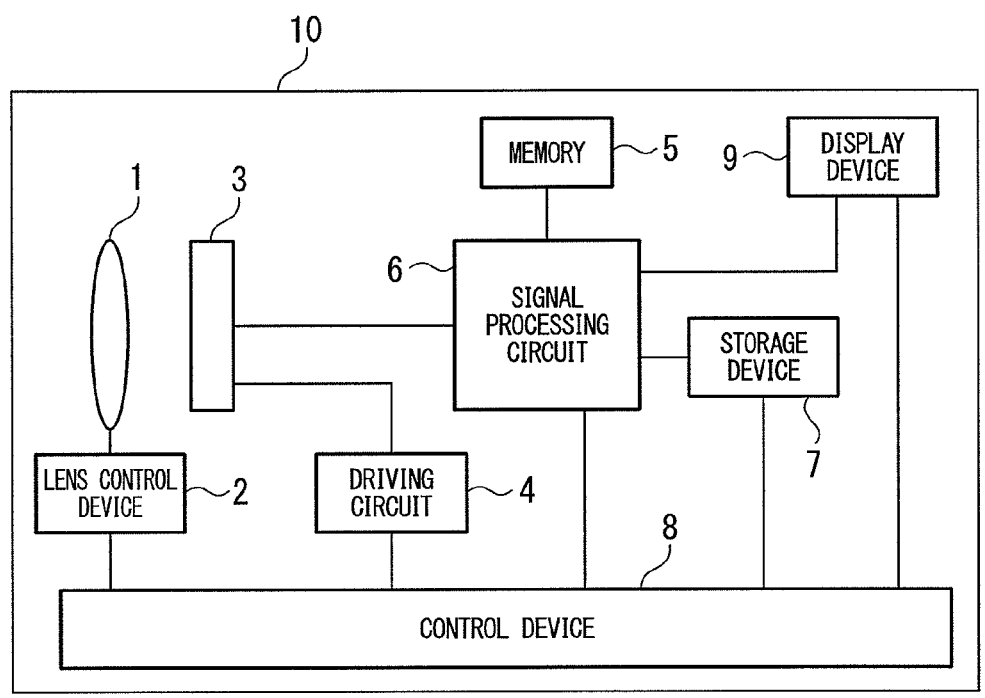
FIG. 1 is a block diagram illustrating a configuration of an imaging apparatus to which a solid-state imaging device according to a first embodiment of the present invention is applied.

First, a first embodiment of the present invention will be described. FIG. 1 illustrates a configuration of a digital camera as an example of an imaging apparatus to which a solid-state imaging device according to the present embodiment has been applied. The imaging apparatus according to an aspect of the present invention may be an electronic device having an imaging function or may be a digital video camera, an endoscope or the like, as well as a digital camera. The digital camera 10 illustrated in FIG. 1 includes a lens unit 1, a lens control device 2, a solid-state imaging device 3, a driving circuit 4, a memory 5, a signal processing circuit 6, a recording device 7, a control device 8, and a display device 9.

From a point of view of hardware, the respective blocks illustrated in FIG. 1 may be realized by various parts, such as electrical circuit parts such as a CPU, a memory and the like of a computer, an optical part such as a lens, and a manipulation part such as a button or a switch. From a point of view of software, the respective blocks illustrated in FIG. 1 may be realized by a computer program or the like. Here, functional blocks realized by both hardware and software are drawn. Accordingly, it can of course be appreciated by those skilled in the art that the functional blocks may be realized in various forms by a combination of hardware and software.

The lens unit 1 includes a zoom lens or a focus lens and forms a subject image on a light receiving surface of the solid-state imaging device 3 based on a light from a subject. The lens control device 2 controls zoom, focus, iris and the like of the lens unit 1. The light captured by the lens unit 1 forms an image on the light receiving surface of the solid-state imaging device 3. The solid-state imaging device 3 converts the subject image formed on the light receiving surface into an image signal and outputs the image signal. A plurality of pixels are two-dimensionally arranged in a row direction and a column direction in the light receiving surface of the solid-state imaging device 3.

The driving circuit 4 drives the solid-state imaging device 3 to control operation of the solid-state imaging device 3. The memory 5 temporarily stores image data. The signal processing circuit 6 performs prescribed processes on an image signal output from the solid-state imaging device 3. The processes performed by the signal processing circuit 6 include amplification of the image signal, various corrections of image data, compression of image data, and the like.

The recording device 7 includes, for example, a semiconductor memory for recording or reading of the image data and is detachably embedded in the digital camera 10. The display device 9 performs display of a moving image (live view image), display of a still image, display of a moving image or a still image recorded in the recording device 7, display of a state of digital camera 10, etc.

The control device 8 performs all control of the digital camera 10. Operation of the control device 8 is defined by a program stored in a ROM embedded in the digital camera 10. The control device 8 reads the program and performs various controls according to content defined by the program.

Figure 2:
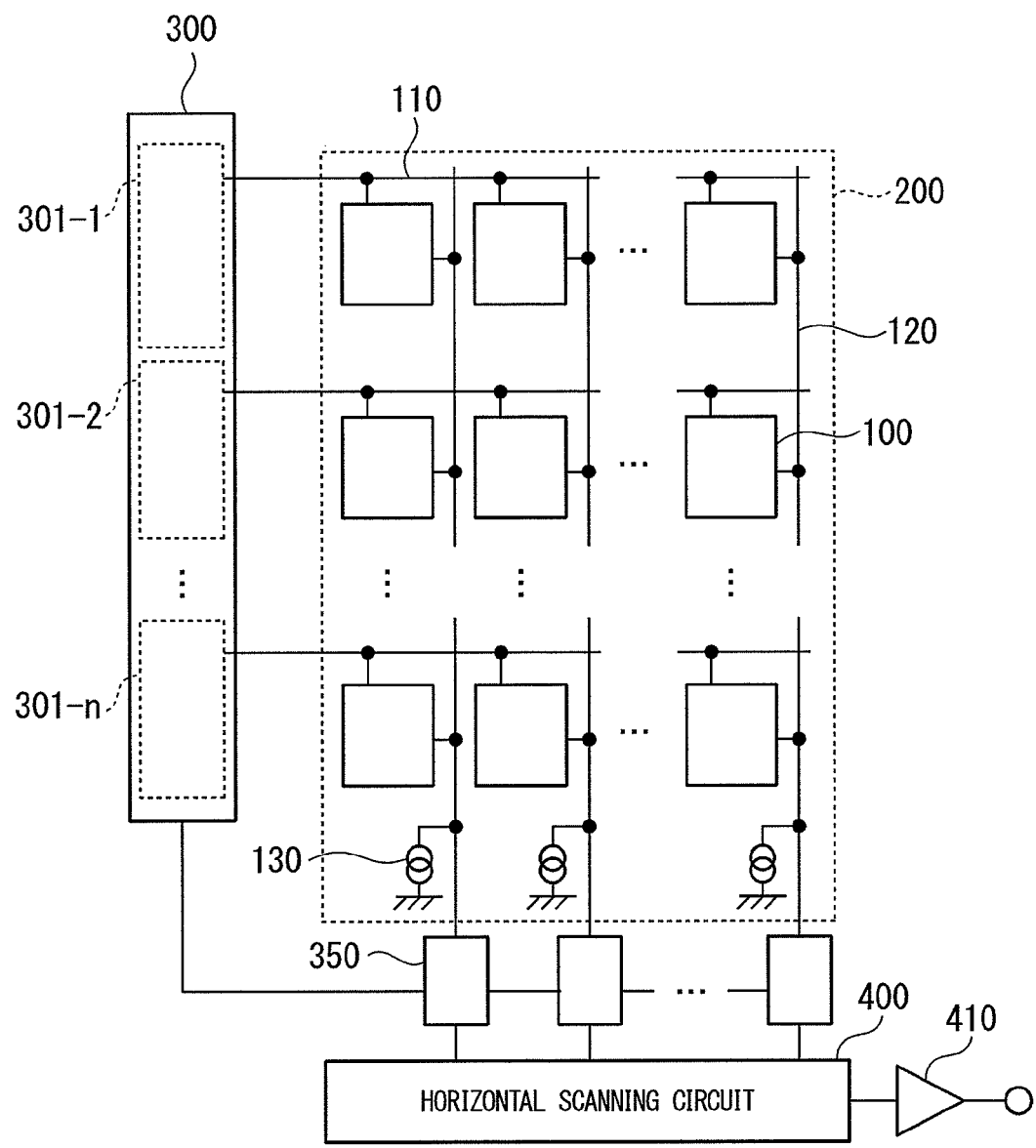
FIG. 2 is a block diagram illustrating a configuration of the solid-state imaging device according to the first embodiment of the present invention.

FIG. 2 illustrates a configuration of the solid-state imaging device 3. The solid-state imaging device illustrated in FIG. 2 includes a pixel portion 200 (a pixel array), a vertical scanning circuit 300, a column processing circuit 350, a horizontal scanning circuit 400, and an output amplifier 410. An arrangement position of each circuit element illustrated in FIG. 2 does not necessarily match an actual arrangement position.

The pixel portion 200 includes pixels 100 arranged in a two-dimensional matrix shape, and a current source 130 provided in each column. In the present embodiment, while a region including all the pixels in the solid-state imaging device 3 is a pixel signal reading target region, a part of the region including all the pixels in the solid-state imaging device 3 may be the reading target region. It is desirable for the reading target region to include at least all pixels in an effective pixel region. Further, the reading target region may include optical black pixels (pixels that are always shielded) arranged outside the effective pixel region. A pixel signal read from the optical black pixel is used, for example, to correct a dark current component.

The vertical scanning circuit 300 performs driving control of the pixel portion 200 in units of rows. In order to perform this driving control, the vertical scanning circuit 300 includes as many unit circuits 301-1, 301-2, . . . , 301-$n$ (n is the number of rows) as the number of rows.

Each unit circuit 301-$i$ (i=1, 2, . . . , n) outputs a control signal for controlling the pixels 100 corresponding to one row to a signal line 110, which is provided in each row. The signal line 110 is connected to the pixel 100 and supplies a control signal output from the unit circuit 301-$i$ to the pixel 100. While each signal line 110 corresponding to each row is represented as one line in FIG. 2, each signal line 110 includes a plurality of signal lines. A signal of the pixel 100 of the row selected by the control signal is output to a vertical signal line 120, which is provided in each column.

The current source 130 is connected to the vertical signal line 120 and constitutes a source follower circuit with an amplification transistor (a second amplification transistor 241, 242, 243 or 244 that will be described below) within the pixel 100. The column processing circuit 350 performs signal processing such as noise suppression on the pixel signal output to the vertical signal line 120. The horizontal scanning circuit 400 outputs pixel signals of the pixels 100 corresponding to one row, which have been output to the vertical signal line 120 and processed by the column processing circuit 350, to the output amplifier 410 in time series in order of an arrangement in a horizontal direction. The output amplifier 410 amplifies the pixel signal output from the horizontal scanning circuit 400 and outputs the resultant signal to the outside of the solid-state imaging device 3 as an image signal.

Figure 3:
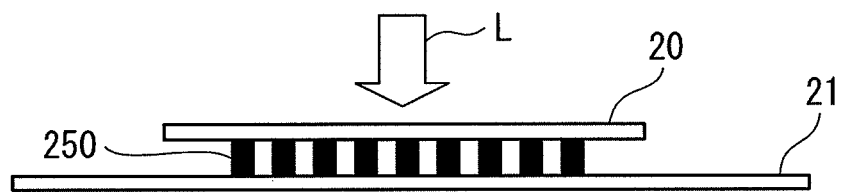
FIG. 3 is a cross-sectional view of the solid-state imaging device according to the first embodiment of the present invention.

FIG. 3 illustrates a cross-sectional structure of the solid-state imaging device 3. The solid-state imaging device 3 has a structure in which two substrates (a first substrate 20 and a second substrate 21) in which circuit elements (e.g., the photoelectric conversion elements, the transistors, and the capacitors) in the pixels 100 are arranged overlap. The circuit elements in the pixels 100 are distributed to and arranged in the first substrate 20 and the second substrate 21. The first substrate 20 and the second substrate 21 are electrically connected so that an electrical signal can be delivered between the two substrates at the time of driving the pixels 100.

Among two main surfaces (surfaces having a relatively greater surface area than side surfaces) of the first substrate 20, the photoelectric conversion elements are formed in the main surface irradiated with light L. The light radiated on the first substrate 20 is incident on the photoelectric conversion elements. A connection part 250 for connection with the second substrate 21 is formed in the main surface opposite to the main surface irradiated with the light L between the two main surfaces of the first substrate 20. A signal based on signal charges generated by the photoelectric conversion element arranged in the first substrate 20 is output to the second substrate 21 via the connection part 250. In an example illustrated in FIG. 3, while the main surfaces of the first substrate 20 and the second substrate 21 have different areas, the main surfaces of the first substrate 20 and the second substrate 21 may have the same area.

Each of the vertical scanning circuit 300, the column processing circuit 350, the horizontal scanning circuit 400, and the output amplifier 410 other than the pixels 100 may be arranged in any one of the first substrate 20 and the second substrate 21. Further, circuit elements in each of the vertical scanning circuit 300, the column processing circuit 350, the horizontal scanning circuit 400, and the output amplifier 410 may be distributed to and arranged in the first substrate 20 and the second substrate 21.

Figure 4:
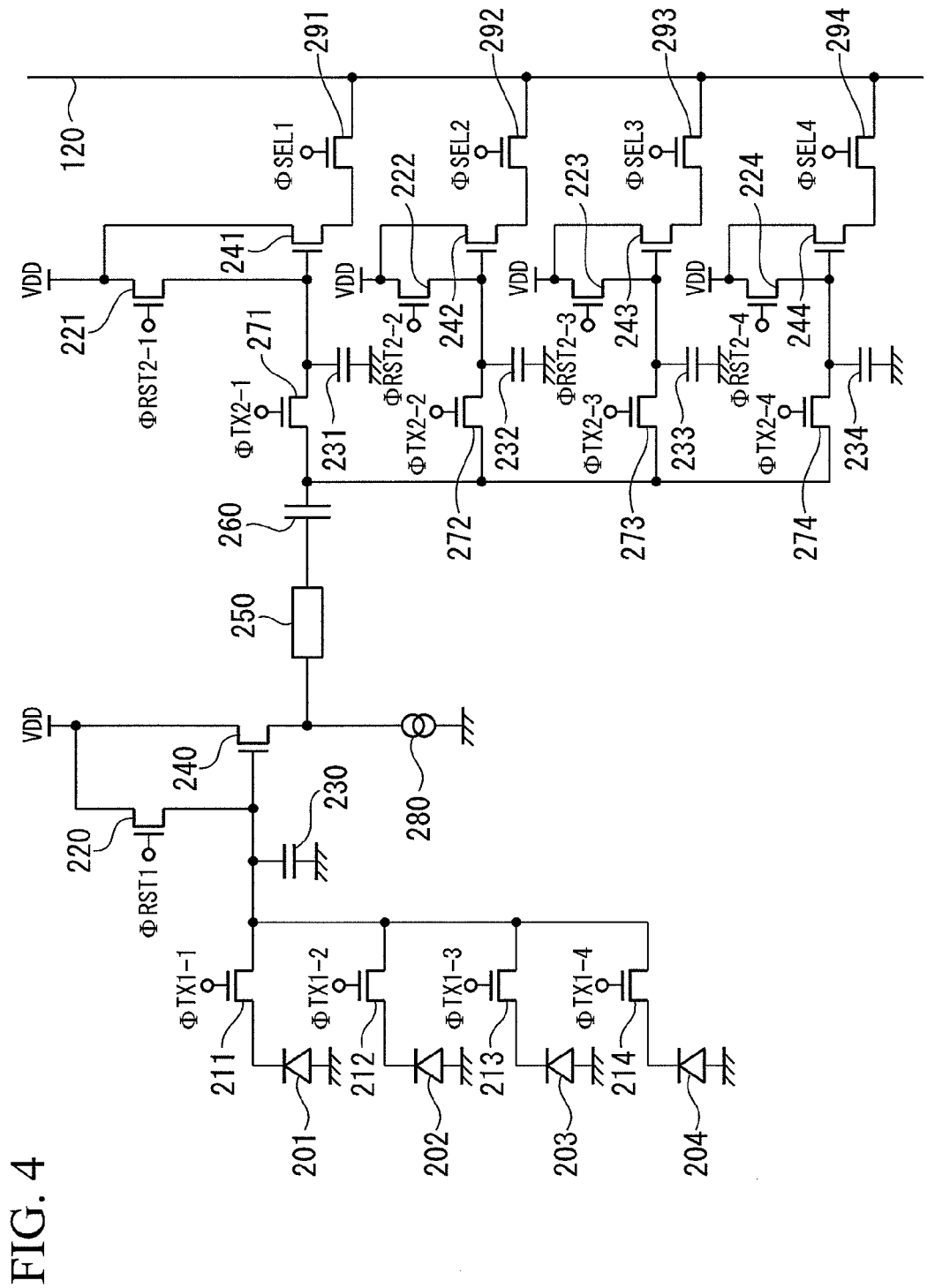
FIG. 4 is a circuit diagram illustrating a circuit configuration of pixels included in the solid-state imaging device according to the first embodiment of the present invention.

FIG. 4 illustrates a circuit configuration of a pixel cell including four pixels 100. In the present embodiment, an example in which some circuit elements are shared in the four pixels arranged in a vertical direction will be described. The pixel cell including four pixels 100 includes photoelectric conversion elements 201, 202, 203 and 204, first transfer transistors 211, 212, 213 and 214, a charge holding unit 230 (floating diffusion), and a first reset transistor 220. The pixel cell including four pixels 100 further includes a first amplification transistor 240, a current source 280, a clamp capacitor 260, second transfer transistors 271, 272, 273 and 274, and second reset transistors 221, 222, 223 and 224. The pixel cell including four pixels 100 further includes analog memories 231, 232, 233, and 234, second amplification transistors 241, 242, 243 and 244, and selection transistors 291, 292, 293, and 294. An arrangement position of each circuit element illustrated in FIG. 4 does not necessarily match an actual arrangement position.

The circuit elements of the four pixels 100 are included in the pixel cell. The first pixel includes the photoelectric conversion element 201, the first transfer transistor 211, the charge holding unit 230, the first reset transistor 220, the first amplification transistor 240, and the current source 280. The first pixel further includes the clamp capacitor 260, the second transfer transistor 271, the second reset transistor 221, the analog memory 231, the second amplification transistor 241, and the selection transistor 291. The second pixel includes the photoelectric conversion element 202, the first transfer transistor 212, the charge holding unit 230, the first reset transistor 220, the first amplification transistor 240, the current source 280, and the clamp capacitor 260. The second pixel further includes the second transfer transistor 272, the second reset transistor 222, the analog memory 232, the second amplification transistor 242, and the selection transistor 292.

The third pixel includes the photoelectric conversion element 203, the first transfer transistor 213, the charge holding unit 230, the first reset transistor 220, the first amplification transistor 240, the current source 280, the clamp capacitor 260, and the second transfer transistor 273. The third pixel further includes the second reset transistor 223, the analog memory 233, the second amplification transistor 243, and the selection transistor 293.

The fourth pixel includes the photoelectric conversion element 204, the first transfer transistor 214, the charge holding unit 230, the first reset transistor 220, the first amplification transistor 240, the current source 280, the clamp capacitor 260, and the second transfer transistor 274. The fourth pixel further includes the second reset transistor 224, the analog memory 234, the second amplification transistor 244, and the selection transistor 294. The charge holding unit 230, the first reset transistor 220, the first amplification transistor 240, the current source 280, and the clamp capacitor 260 are shared by the four pixels 100.

One terminals of the photoelectric conversion elements 201, 202, 203 and 204 are grounded. Drain terminals of the first transfer transistors 211, 212, 213 and 214 are connected to the other terminals of the photoelectric conversion elements 201, 202, 203 and 204. Gate terminals of the first transfer transistors 211, 212, 213 and 214 are connected to the vertical scanning circuit 300, and transfer pulses ΦTX1-1, ΦTX1-2, ΦTX1-3, and ΦTX1-4 are supplied to the gate terminals.

One terminal of the charge holding unit 230 is connected to source terminals of the first transfer transistors 211, 212, 213 and 214, and the other terminal of the charge holding unit 230 is grounded. A drain terminal of the first reset transistor 220 is connected to a supply voltage VDD, a source terminal of the first reset transistor 220 is connected to the source terminals of the first transfer transistors 211, 212, 213 and 214. A gate terminal of the first reset transistor 220 is connected to the vertical scanning circuit 300, and a reset pulse ΦRST1 is supplied to the gate terminal.

A drain terminal of the first amplification transistor 240 is connected to the supply voltage VDD. A gate terminal that is an input part of the first amplification transistor 240 is connected to the source terminals of the first transfer transistors 211, 212, 213 and 214. One terminal of the current source 280 is connected to a source terminal of the first amplification transistor 240, and the other terminal of the current source 280 is grounded. For example, the current source 280 may include a transistor having a drain terminal connected to the source terminal of the first amplification transistor 240, a grounded source terminal, and a gate terminal connected to the vertical scanning circuit 300. One terminal of the clamp capacitor 260 is connected to the source terminal of the first amplification transistor 240 and the one terminal of the current source 280 via the connection part 250.

Drain terminals of the second transfer transistors 271, 272, 273 and 274 are connected to the other terminal of the clamp capacitor 260. Gate terminals of the second transfer transistors 271, 272, 273 and 274 are connected to the vertical scanning circuit 300, and transfer pulses ΦTX2-1, ΦTX2-2, TX2-3, and ΦTX2-4 are supplied to the gate terminals.

Drain terminals of the second reset transistors 221, 222, 223 and 224 are connected to the supply voltage VDD, and source terminals of the second reset transistors 221, 222, 223 and 224 are connected to source terminals of the second transfer transistors 271, 272, 273 and 274. Gate terminals of the second reset transistors 221, 222, 223 and 224 are connected to the vertical scanning circuit 300, and reset pulses ΦRST2-1, ΦRST2-2, ΦRST2-3 and ΦRST2-4 are supplied to the gate terminals.

One terminals of the analog memories 231, 232, 233, and 234 are connected to the source terminals of the second transfer transistors 271, 272, 273 and 274, and the other terminals of the analog memories 231, 232, 233, and 234 are grounded. Drain terminals of the second amplification transistors 241, 242, 243 and 244 are connected to the supply voltage VDD. Gate terminals that are input parts of the second amplification transistors 241, 242, 243 and 244 are connected to the source terminals of the second transfer transistors 271, 272, 273 and 274. Drain terminals of the selection transistors 291, 292, 293, and 294 are connected to the source terminals of the second amplification transistors 241, 242, 243 and 244, and source terminals of the selection transistors 291, 292, 293, and 294 are connected to the vertical signal line 120. Gate terminals of the selection transistors 291, 292, 293, and 294 are connected to the vertical scanning circuit 300, and selection pulses ΦSEL1, ΦSEL2, ΦSEL3, and ΦSEL4 are supplied to the gate terminals.

For each transistor described above, a polarity may be reversed and the source terminals and the drain terminals may be the reverse of that indicated above.

The photoelectric conversion elements 201, 202, 203 and 204 are, for example, photodiodes, generate (produce) signal charges based on incident light, and hold and accumulate the generated (produced) signal charges. The first transfer transistors 211, 212, 213 and 214 are transistors that transfer the signal charges accumulated in the photoelectric conversion elements 201, 202, 203 and 204 to the charge holding unit 230. On/off of the first transfer transistors 211, 212, 213 and 214 is controlled by transfer pulses ΦTX1-1, ΦTX1-2, ΦTX1-3, and ΦTX1-4 from the vertical scanning circuit 300. The charge holding unit 230 is a floating diffusion capacitor that temporarily holds and accumulates the signal charges transferred from the photoelectric conversion elements 201, 202, 203 and 204.

The first reset transistor 220 is a transistor that resets the charge holding unit 230. On/off of the first reset transistor 220 is controlled by the reset pulse ΦRST1 from the vertical scanning circuit 300. The photoelectric conversion elements 201, 202, 203 and 204 may be reset by simultaneously turning the first reset transistor 220 and the first transfer transistors 211, 212, 213 and 214 on. The reset of the charge holding unit 230/the photoelectric conversion elements 201, 202, 203 and 204 is performed by controlling an amount of charges accumulated in the charge holding unit 230/the photoelectric conversion elements 201, 202, 203 and 204. The reset of the charge holding unit 230/the photoelectric conversion elements 201, 202, 203 and 204 is to set states (potentials) of the charge holding unit 230/the photoelectric conversion elements 201, 202, 203 and 204 to a reference state (a reference potential or a reset level).

The first amplification transistor 240 is a transistor that outputs, from the source terminal, an amplification signal input to the gate terminal, in which the amplification signal is obtained by amplifying a signal based on the signal charges accumulated in the charge holding unit 230. The current source 280 functions as a load of the first amplification transistor 240 and supplies current to the first amplification transistor 240 to drive the first amplification transistor 240. The first amplification transistor 240 and the current source 280 constitute a source follower circuit.

The clamp capacitor 260 is a capacitor that clamps (fixes) a voltage level of the amplification signal output from the first amplification transistor 240. The second transfer transistors 271, 272, 273 and 274 are transistors that sample and hold a voltage level of the other terminal of the clamp capacitor 260 and accumulate the voltage in the analog memories 231, 232, 233, and 234. On/off of the second transfer transistors 271, 272, 273 and 274 is controlled by the transfer pulses ΦTX2-1, ΦTX2-2, ΦTX2-3, and ΦTX2-4 from the vertical scanning circuit 300.

The second reset transistors 221, 222, 223 and 224 are transistors that reset analog memories 231, 232, 233, and 234. On/off of the second reset transistors 221, 222, 223 and 224 is controlled by reset pulses ΦRST2-1, ΦRST2-2, ΦRST2-3 and ΦRST2-4 from the vertical scanning circuit 300. Reset of analog memories 231, 232, 233, and 234 is control of an amount of the charges accumulated in the analog memories 231, 232, 233, and 234 to set states (potentials) of the analog memories 231, 232, 233, and 234 to a reference state (a reference potential or a reset level). The analog memories 231, 232, 233, and 234 hold and accumulate the analog signals sampled and held by the second transfer transistors 271, 272, 273 and 274.

Capacitance of the analog memories 231, 232, 233, and 234 is set to be greater than that of the charge holding unit 230. It is more desirable for an MIM (Metal Insulator Metal) capacitor or an MOS (Metal Oxide Semiconductor) capacitor having small leak current (dark current) per unit area to be used as the analog memories 231, 232, 233, and 234. Accordingly, immunity to noise can be improved and a high-quality signal can be obtained.

The second amplification transistors 241, 242, 243 and 244 are transistors that output, from the source terminals, an amplification signal input to the gate terminals, in which the amplification signal is obtained by amplifying a signal based on the signal charges accumulated in the analog memories 231, 232, 233, and 234. The second amplification transistors 241, 242, 243 and 244 and the current sources 130 connected to the vertical signal line 120 constitute a source follower circuit. The selection transistors 291, 292, 293, and 294 are transistors that select the pixels 100 and send outputs of the second amplification transistors 241, 242, 243 and 244 to the vertical signal line 120. On/off of the selection transistors 291, 292, 293, and 294 is controlled by the selection pulses ΦSEL1, ΦSEL2, ΦSEL3, and ΦSEL4 from the vertical scanning circuit 300.

Among the circuit elements illustrated in FIG. 4, the photoelectric conversion elements 201, 202, 203 and 204, the first transfer transistors 211, 212, 213 and 214, the charge holding unit 230, the first reset transistor 220, the first amplification transistor 240, and the current source 280 are arranged in the first substrate 20. Further, the clamp capacitor 260, the second transfer transistors 271, 272, 273 and 274, the second reset transistors 221, 222, 223 and 224, and the analog memories 231, 232, 233, and 234 are arranged in the second substrate 21. Further, the second amplification transistors 241, 242, 243 and 244 and the selection transistors 291, 292, 293, and 294 are arranged in the second substrate 21.

A connection part 250 is arranged between the first substrate 20 and the second substrate 21. The amplification signal output from the first amplification transistor 240 in the first substrate 20 is output to the second substrate 21 via the connection part 250.

In FIG. 4, the connection part 250 is arranged in a path between the source terminal of the first amplification transistor 240 and the one terminal of the current source 280 and the one terminal of the clamp capacitor 260, but is not limited thereto. The connection part 250 may be arranged on a path electrically connected from the first transfer transistors 211, 212, 213 and 214 to the second transfer transistors 271, 272, 273 and 274.

For example, the connection part 250 may be arranged on a path among the source terminals of the first transfer transistors 211, 212, 213 and 214, the one terminal of the charge holding unit 230, the source terminal of the first reset transistor 220, and the gate terminal of the first amplification transistor 240. Alternatively, the connection part 250 may be arranged on a path between the other terminal of the clamp capacitor 260 and the drain terminals of the second transfer transistors 271, 272, 273 and 274.

Figure 5:
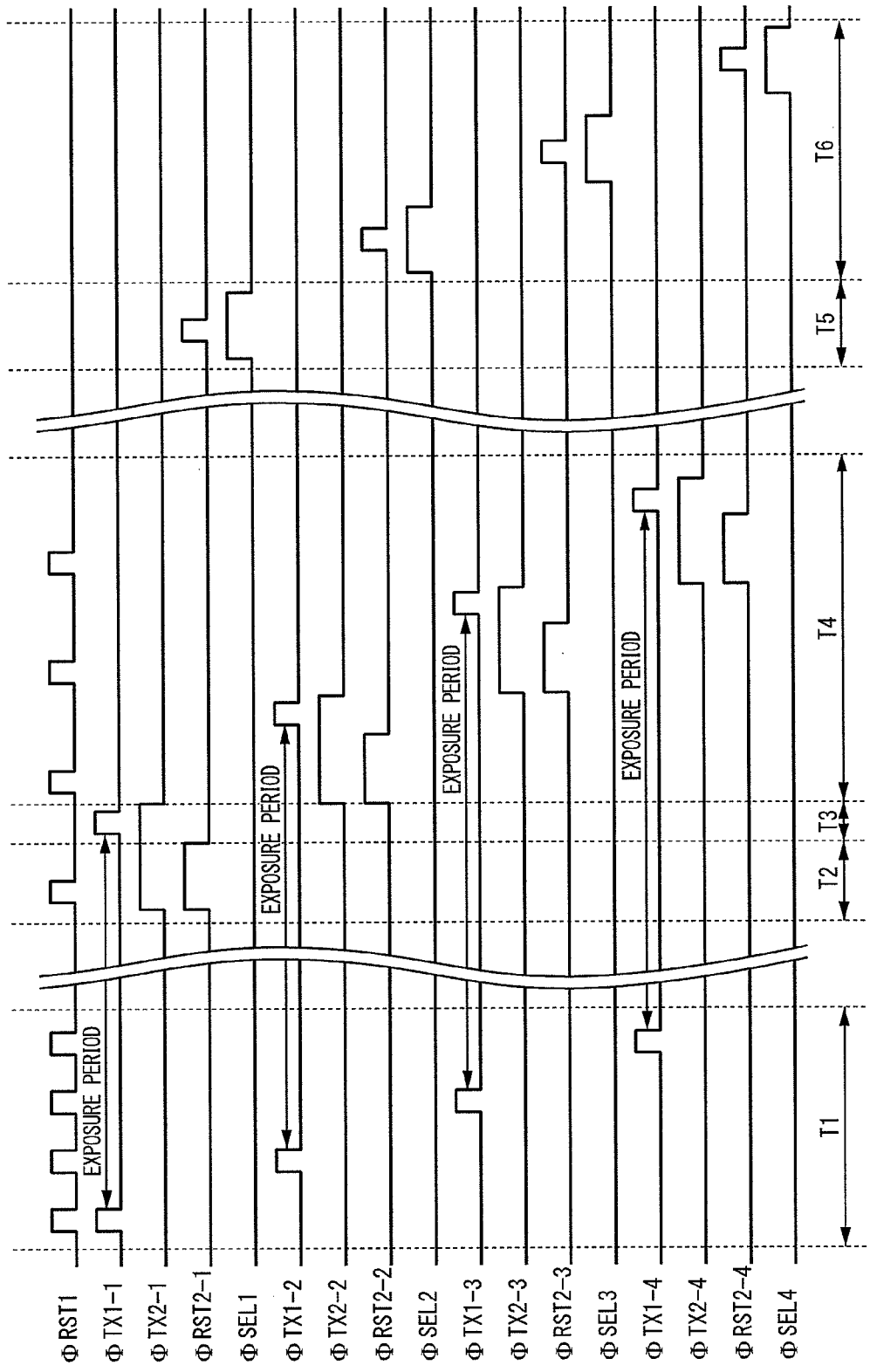
FIG. 5 is a timing chart illustrating operation of the pixels included in the solid-state imaging device according to the first embodiment of the present invention.

Next, operation of the pixels 100 will be described with reference to FIG. 5. FIG. 5 illustrates control signals supplied from the vertical scanning circuit 300 to the pixels 100 in each row. Hereinafter, operation will be described in units of the pixel cell including the four pixels illustrated in FIG. 4.

<Operation in Period T1>

First, as the reset pulse ΦRST1 is changed from an "L" (Low) level to an "H" (High) level, the first reset transistor 220 is turned on. Simultaneously, as the transfer pulse ΦTX1-1 is changed from the "L" level to the "H" level, the first transfer transistor 211 is turned on.

Accordingly, the photoelectric conversion element 201 of the first pixel is reset.

Subsequently, as the reset pulse ΦRST1 and the transfer pulse ΦTX1-1 are changed from the "H" level to the "L" level, the first reset transistor 220 and the first transfer transistor 211 are turned off. Accordingly, reset of the photoelectric conversion element 201 of the first pixel ends, and exposure of the first pixel (accumulation of signal charges) starts. Similarly, the photoelectric conversion element 202 of the second pixel, the photoelectric conversion element 203 of the third pixel, and the photoelectric conversion element 204 of the fourth pixel are reset in order, and exposure of each pixel starts. In FIG. 4, the reset pulse ΦRST1 changes to the "H" level at a timing at which the transfer pulses ΦTX1-1, ΦTX1-2, ΦTX1-3, and ΦTX1-4 change to the "H" level. However, the reset pulse ΦRST1 may always be in the "H" level during reset of the photoelectric conversion elements 201, 202, 203 and 204.

<Operation in Period T2>

Subsequently, as the reset pulse ΦRST2-1 is changed from the "L" level to the "H" level, the second reset transistor 221 is turned on. Accordingly, the analog memory 231 is reset. Simultaneously, as the transfer pulse ΦTX2-1 is changed from the "L" level to the "H" level, the second transfer transistor 271 is turned on. Accordingly, a potential of the other terminal of the clamp capacitor 260 is reset to the supply voltage VDD and the second transfer transistor 271 starts sample and hold of the potential of the other terminal of the clamp capacitor 260.

Subsequently, as the reset pulse ΦRST1 is changed from the "L" level to the "H" level, the first reset transistor 220 is turned on. Accordingly, the charge holding unit 230 is reset. Subsequently, as the reset pulse ΦRST1 is changed from the "H" level to the "L" level, the first reset transistor 220 is turned off. Accordingly, the reset of the charge holding unit 230 ends. A timing at which the reset of the charge holding unit 230 is performed may be in an exposure period. As the reset of the charge holding unit 230 is performed at a timing immediately before the exposure period ends, it is possible to further reduce a noise due to leak current of the charge holding unit 230.

Subsequently, as the reset pulse ΦRST2-1 is changed from the "H" level to the "T" level, the second reset transistor 221 is turned off. Accordingly, the reset of the analog memory 231 ends. At this time point, the clamp capacitor 260 clamps the amplification signal output from the first amplification transistor 240 (the amplification signal after reset of the charge holding unit 230).

<Operation in Period T3>

First, as the transfer pulse ΦTX1-1 is changed from the "L" level to the "H" level, the first transfer transistor 211 is turned on. Accordingly, the signal charges accumulated in the photoelectric conversion element 201 are transferred to the charge holding unit 230 via the first transfer transistor 211, and accumulated in the charge holding unit 230. Accordingly, the exposure of the first pixel (the accumulation of the signal charges) ends. A period from exposure start of the first pixel in the period T1 to exposure end of the first pixel in the period T3 is the exposure period (a signal accumulation period). Subsequently, as the transfer pulse ΦTX1-1 is changed from the "H" level to the "L" level, the first transfer transistor 211 is turned off.

Subsequently, as the transfer pulse ΦTX2-1 is changed from the "H" level to the "L" level, the second transfer transistor 271 is turned off. Accordingly, the second transfer transistor 271 ends sample and hold of the potential of the other terminal of the clamp capacitor 260.

<Operation in Period T4>

The operations in the periods T2 and T3 described above are operations of the first pixel. In a period T4, the same operations as the operations in the periods T2 and T3 are performed on each of the second pixel, the third pixel, and the fourth pixel. It is more desirable for lengths of the exposure period of the respective pixels to be equal.

Hereinafter, a change in the potential of the one terminal of the analog memory 231 will be described. The same applies to changes in potentials of one terminale of the analog memories 232, 233, and 234. A change in the potential of the one terminal of the charge holding unit 230 due to the transfer of the signal charges from the photoelectric conversion element 201 to the charge holding unit 230 after the reset of the charge holding unit 230 ends is assumed to be ΔVfd, and a gain of the first amplification transistor 240 is assumed to be α1. In this case, a change ΔVamp1 in a potential of the source terminal of the first amplification transistor 240 due to the transfer of the signal charges from the photoelectric conversion element 201 to the charge holding unit 230 becomes α1×ΔVfd.

A total gain of the analog memory 231 and the second transfer transistor 271 is assumed to α2. In this case, a change ΔVmem in the potential of the one terminal of the analog memory 231 due to sample and hold of the second transfer transistor 271 after the signal charges are transferred from the photoelectric conversion element 201 to the charge holding unit 230 becomes α2×ΔVamp1, i.e., α1×α2×ΔVfd. The potential of the one terminal of the analog memory 231 at a time point at which the reset of the analog memory 231 ends is the supply voltage VDD. Accordingly, the potential Vmem of the one terminal of the analog memory 231 sampled and held by the second transfer transistor 271 after the signal charges are transferred from the photoelectric conversion element 201 to the charge holding unit 230 is represented by the following Equation (1). In Equation (1), ΔVmem<0 and ΔVfd<0.

$$Vmem = VDD + \Delta Vmem \quad (1)$$
$$= VDD + \alpha 1 \times \alpha 2 \times \Delta Vfd$$

Further, α2 is represented by the following Equation (2). In Equation (2), CL denotes a capacitance value of the clamp capacitor 260 and CSH denotes a capacitance value of the analog memory 231. In order to reduce degradation of the gain, it is more desirable for the capacitance CL of the clamp capacitor 260 to be greater than the capacitance CSH of the analog memory 231.

$$\alpha 2 = \frac{CL}{CL + CSH} \quad (2)$$

<Operation in Period T5>

In a period T5, signals based on the signal charges accumulated in the analog memories 231, 232, 233, and 234 are sequentially read for each row. First, reading of the signal from the first pixel is performed. As the selection pulse ΦSET1 is changed from the "L" level to the "H" level, the selection transistor 291 is turned on. Accordingly, the signal based on the potential Vmem shown in Equation (1) is output to the vertical signal line 120 via the selection transistor 291.

Subsequently, as the reset pulse ΦRST2-1 is changed from the "L" level to the "H" level, the second reset transistor 221 is turned on. Accordingly, the analog memory 231 is reset and the signal based on the potential of the one terminal of the analog memory 231 at the time of reset is output to the vertical signal line 120 via the selection transistor 291.

Subsequently, as the reset pulse ΦRST2-1 is changed from the "H" level to the "L" level, the second reset transistor 221 is turned off. As the selection pulse ΦSET1 is then changed from the "H" level to the "L" level, the selection transistor 291 is turned off.

The column processing circuit 350 generates a difference signal having a difference between the signal based on the potential Vmem shown in Equation (1) and the signal based on the potential of the one terminal of the analog memory 231 when the analog memory 231 is reset. This difference signal is a signal based on a difference between the potential Vmem shown in Equation (1) and the supply voltage VDD. The difference signal is a signal based on a difference ΔVfd between the potential of the one terminal of the charge holding unit 230 immediately after the signal charges accumulated in the photoelectric conversion element 201 are transferred to the charge holding unit 230 and the potential of the charge holding unit 230 immediately after the one terminal of the charge holding unit 230 is reset. Accordingly, it is possible to obtain a signal component based on the signal charges accumulated in the photoelectric conversion element 201 in which a noise component due to the reset of the analog memory 231 and a noise component due to the reset of the charge holding unit 230 are suppressed.

The signal output from the column processing circuit 350 is output to the output amplifier 410 by the horizontal scanning circuit 400. The output amplifier 410 processes the signal from the horizontal scanning circuit 400 and outputs the resultant signal as an image signal. Then, reading of the signal from the first pixel ends.

<Operation in Period T6>

Subsequently, the same operation as that of the first pixel in the period T5 is performed on the respective pixels of the second, third, and fourth pixels.

In the above operation, the charge holding unit 230 should hold the signal charges transferred from the photoelectric conversion elements 201, 202, 203 and 204 to the charge holding unit 230 until a reading timing of each pixel 100. If a noise is generated during a period in which the charge holding unit 230 holds the signal charges, the noise is superimposed on the signal charges held in the charge holding unit 230 to deteriorate signal quality (S/N).

The noise generated during the period in which the charge holding unit 230 holds the signal charges (hereinafter described as a holding period) is mainly caused by charges due to leak current of the charge holding unit 230 (hereinafter described as leak charges). Further, the noise generated during the period in which the charge holding unit 230 holds the signal charges (hereinafter described as a holding period) is mainly caused by charges due to light incident on parts other than the photoelectric conversion elements 201, 202, 203 and 204 (hereinafter described as light charges). When the leak charges and the light charges generated in a unit time are qid and qpn, respectively, and a length of the holding period is tc, noise charges Qn generated during the holding period are (qid+qpn)tc.

It is assumed that capacitance of the charge holding unit 230 is Cfd, capacitance of the analog memories 231, 232, 233, and 234 is Cmem, and a ratio of Cfd and Cmem (Cmem/Cfd) is A. It is also assumed that the gain of the first amplification transistor 240 is α1 and the total gain of the analog memories 231, 232, 233, and 234 and the second transfer transistors 271, 272, 273 and 274 is α2, as described above. When the signal charges generated in the photoelectric conversion elements 201, 202, 203 and 204 during the exposure period are Qph, signal charges held in the analog memories 231, 232, 233, and 234 after the exposure period ends are A×α1×α2×Qph.

The signal based on the signal charges transferred from the photoelectric conversion elements 201, 202, 203 and 204 to the charge holding unit 230 is sampled and held by the second transfer transistors 271, 272, 273 and 274 and stored in the analog memories 231, 232, 233, and 234. Accordingly, a period of time from the transfer of the signal charges to the charge holding unit 230 to the storage of the signal charges in the analog memories 231, 232, 233, and 234 is short and the noise generated in the charge holding unit 230 is negligible. If the noise generated in the period in which the analog memories 231, 232, 233, and 234 hold the signal charges is assumed to be the same Qn as that described above, an S/N is A×α1Δα2×Qph/Qn.

Meanwhile, an S/N when signal charges held in a capacitor accumulation unit are read from a pixel via an amplification transistor, as in the related art described in Patent Document 2, is Qph/Qn. Accordingly, the S/N of the present embodiment is A×α1×α2 times the S/N of the related art. When capacitance values of the analog memories 231, 232, 233, and 234 are set so that A×α1×α2 is greater than 1, deterioration of signal quality can be reduced. For example, when the capacitance values of the analog memories 231, 232, 233, and 234 are sufficiently greater than that of the charge holding unit 230, the deterioration of signal quality can be reduced.

Figure 6:
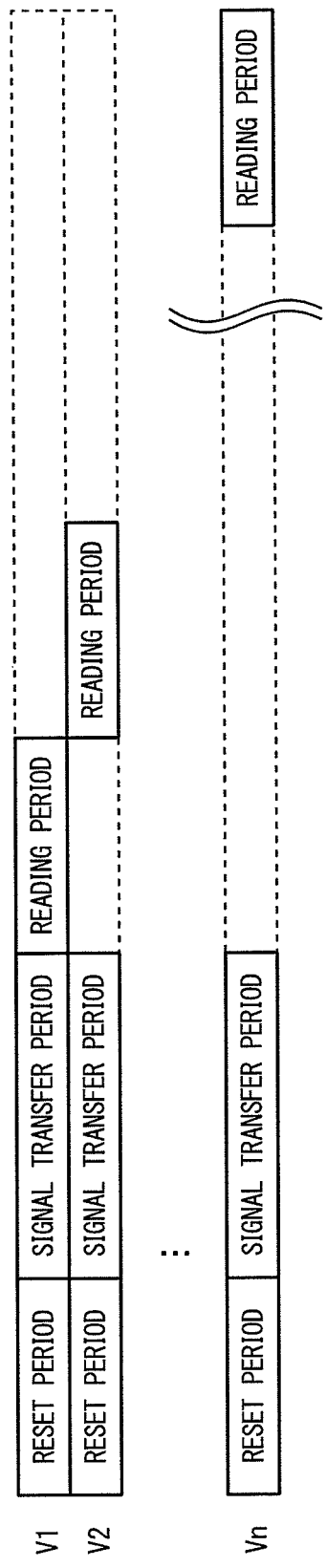
FIG. 6 is a timing chart illustrating operation of the pixels included in the solid-state imaging device according to the first embodiment of the present invention.

In the present embodiment, timings of operation of pixel cells whose positions in the vertical direction (hereinafter described as vertical positions) are the same are the same, but timings of operation of pixel cells whose vertical positions are different are different. FIG. 6 schematically illustrates the timings of the operation of pixel cells whose vertical positions (V1, V2, . . . , Vn) are different. In FIG. 6, a position in the vertical direction indicates a vertical position in the array of pixel cells, and a position in the horizontal direction indicates a time position.

A reset period corresponds to the period T1 in FIG. 5, a signal transfer period corresponds to the periods T2, T3, and T4 in FIG. 5, and a reading period corresponds to the periods T5 and T6 in FIG. 5. As illustrated in FIG. 6, in the pixel cells whose vertical positions are different, the reset periods and the signal transfer periods are the same. On the other hand, in the pixel cells whose vertical positions are different, the reading periods are different. In the operation described above, exposure timings are different among the respective pixels within the same pixel cell, but simultaneity of the exposure can be realized in the entire pixel cell.

Figure 7:
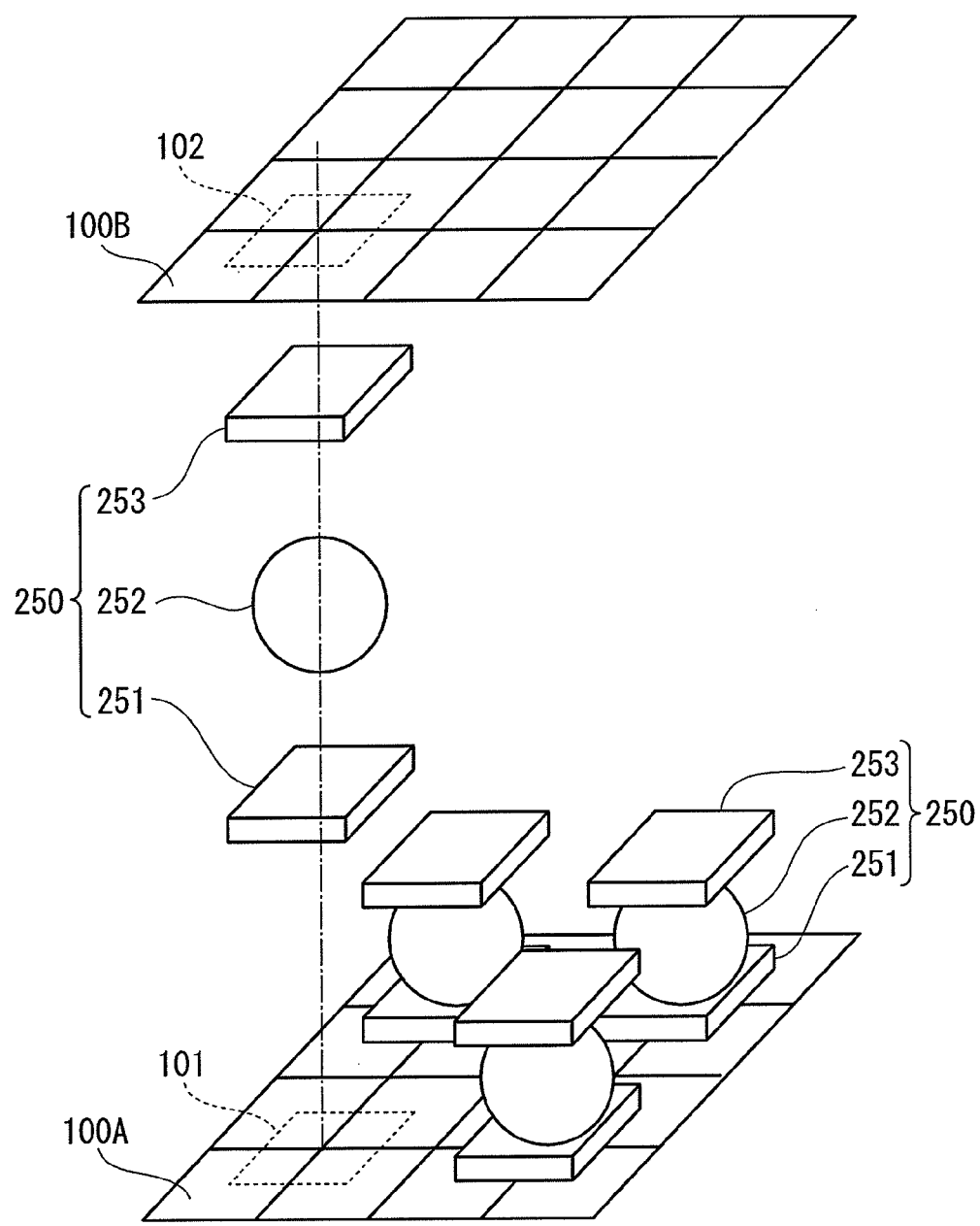
FIG. 7 is a schematic diagram illustrating a configuration of a connection part included in the solid-state imaging device according to the first embodiment of the present invention.

Next, a configuration of the connection part 250 will be described. FIG. 7 schematically illustrates the configuration of the connection part 250. As illustrated in FIG. 7, the connection part 250 includes micro-pads 251 and 253 and a micro-bump 252. One connection part 250 is arranged in each pixel cell including four pixels. The micro-pad 251, which is an electrode for connection with the second substrate 21, is formed in the main surface opposite to the main surface irradiated with light L among the two main surfaces of the first substrate 20 illustrated in FIG. 3. Further, the micro-pad 253, which is an electrode for connection with the first substrate 20, is formed in a position corresponding to the micro-pad 251 in the main surface opposite to the first substrate 20 among the two main surfaces of the second substrate 21.

The micro-bump 252 is formed between the micro-pad 251 and the micro-pad 253. The first substrate 20 and the second substrate 21 are arranged to overlap while the micro-pad 251 and the micro-pad 253 face each other, and are integrally formed so that the micro-pad 251 and the micro-pad 253 are electrically connected by the micro-bump 252.

The micro-pad 251 is bonded to the first substrate 20 in a region 101 on the array of the pixels 100A (a connection region) in the first substrate 20. In other words, the micro-pad 251 is connected to the pixels 100A on the first substrate 20 in the region 101. An area of the region 101 within a surface of the array of the pixels 100A is the same as an area of the micro-pad 251. Further, the micro-pad 253 is bonded to the second substrate 21 in a region 102 on an array of pixels 100B in the second substrate 21. In other words, the micro-pad 253 is connected to the pixels 100B on the second substrate 21 in the region 102. An area of the region 102 within a surface of the array of the pixels 100B is the same as area of the micro-pad 253.

In the present embodiment, the micro-bump is provided. However, the first substrate 20 and the second substrate 21 may be connected without the micro-bump by directly bonding the micro-pad (the first electrode) provided in the surface of the first substrate 20 and the micro-pad (the second electrode) provided in the surface of the second substrate 21. In a configuration other than the pixels 100, delivery of signals between the first substrate 20 and the second substrate 21 may be necessary. In this case, similarly, the first substrate 20 and the second substrate 21 may be connected using the micro-pads and the micro-bump or the first substrate 20 and the second substrate 21 may be connected by directly connecting the micro-pads.

Next, an arrangement position of the connection part 250 with respect to the array of the pixels 100 will be described. While the arrangement position of the connection part 250 with respect to the array of the pixels 100A in the first substrate 20 will be described hereinafter, the same applies to the arrangement position of the connection part 250 with respect to the array of the pixels 100B in the second substrate 21.

FIGS. 8A to 8C illustrate arrangement positions of the connection part 250 with respect to the array of the pixels 100A in the first substrate 20. FIGS. 8A to 8C illustrate states in which the pixels 100A are viewed from a direction perpendicular to a surface of the pixel portion 200. Each of a pixel cell 140A illustrated in FIG. 8A and a pixel cell 140B illustrated in FIG. 8B includes four pixels 100A whose horizontal positions (column positions) are the same and vertical positions (row positions) differ and which are continuously arranged in a vertical direction within a surface of the pixel portion 200. All pixels 100A in the pixel portion 200 are classified into any one of the pixel cells 140A and 140B. A connection part 250A corresponding to the pixel cell 140A is formed to be across two upper pixels 100A within the pixel cell 140A. Further, a connection part 250B corresponding to the pixel cell 140B is formed to be across two lower pixels 100A within the pixel cell 140B.

As illustrated in FIG. 8C, the pixel cell 140A and the pixel cell 140B are arranged to be adjacent in a horizontal direction in the pixel portion 200. A position of the connection part 250A corresponding to the pixel cell 140A and a position of the connection part 250B corresponding to the pixel cell 140B are determined in advance so that a positional relationship therebetween is such a predetermined positional relationship that a clearance between the connection part 250A and the connection part 250B can be sufficiently secured. The position of the connection part 250A may be rephrased with the position of the connection region 101 for connection with the connection part 250A. The position of the connection part 250B may be rephrased with the position of the connection region 101 for connection with the connection part 250B.

For example, the position of the connection part 250A is determined as a predetermined position in a region of a combination of the pixel cells 140A and 140B. The position of the connection part 250B is determined as a position having a predetermined geometric relationship with the position of the connection part 250A according to the position of the connection part 250A in the region of the combination of the pixel cells 140A and 140B. In an example illustrated in FIG. 8C, the position of the connection part 250A is determined as a center position of the two upper pixels 100A within the pixel cell 140A and the two upper pixels 100A within the pixel cell 140B. The position of the connection part 250B is determined as a center position of the two lower pixels 100A within the pixel cell 140A and the two lower pixels 100A within the pixel cell 140B.

Accordingly, the connection part 250A is formed to be across the two upper pixels 100A within the pixel cell 140A and the two upper pixels 100A within the pixel cell 140B. The connection part 250B is formed to be across the two lower pixels 100A within the pixel cell 140A and the two lower pixels 100A within the pixel cell 140B.

In the example illustrated in FIG. 8C, the connection parts 250A and 250B are distributed and arranged so that a distance between the connection part 250A and the connection part 250B is equal to or greater than a predetermined distance in the region of the combination of the pixel cells 140A and 140B.

Further, the connection parts 250A and 250B are in positions symmetrical with respect to a center point P1 of the region of the combination of the pixel cells 140A and 140B. As the connection parts 250A and 250B are formed to be across the adjacent pixel cells 140A and 140B, the connection parts 250A and 250B can be distributed and arranged within the region of the combination of the pixel cells 140A and 140B.

In a state in which the pixel cell 140A and the pixel cell 140B are arranged to be adjacent as illustrated in FIG. 8C, a sufficient clearance between the connection part 250A and the connection part 250B can be secured. The pixel portion 200 is configured by arranging pixel units each including the pixel cell 140A and the pixel cell 140B in a two-dimensional direction.

As described above, one pixel unit is configured by combining the two pixel cells in which the positions of the connection parts 250 within the pixel cells differ. As the pixel portion 200 includes such pixel units, the connection parts 250 can be arranged with a pitch that is twice the pixel pitch in a horizontal direction within the surface of the pixel portion 200. Further, the connection parts 250 can be arranged with a pitch that is twice the pixel pitch in a vertical direction within the surface of the pixel portion 200. As a result, when the pixel cell includes a plurality of pixels 100 arranged in the vertical direction within the surface of the pixel portion 200, clearances between the connection parts 250 in both the vertical direction and the horizontal direction within the surface of the pixel portion 200 can be secured.

In the present embodiment, the pixel cell includes the four pixels 100 continuously arranged in the vertical direction, but the present invention is not limited thereto and it is understood that variations may be made to the invention without departing from the object. Further, the pixel cell may include a plurality of pixels 100 arranged in the horizontal direction as long as it can correspond to increase in the number of signal lines.

As described above, according to the present embodiment, since the connection region connected with the connection part corresponding to any pixel cell is in a position according to the position of the connection region connected with the connection part corresponding to the other pixel cell, the clearance between the connection parts can be secured. Further, as the connection region of one pixel cell among the adjacent pixel cells and the connection region of the other pixel cell have a predetermined positional relationship, the clearance between the connection parts in the adjacent pixel cells can be secured. In the present embodiment, the clearance between the connection parts within the pixel unit including two pixel cells can be secured.

Further, since some circuit elements are shared by a plurality of pixels, a chip area can be reduced as compared to a case in which circuit elements are not shared by a plurality of pixels. Further, since the first amplification transistor 240 and the current source 280 are shared by a plurality of pixels, it is possible to suppress the number of simultaneously operating current sources. Accordingly, it is possible to reduce occurrence of voltage drop of a supply voltage, increase in a GND (ground) voltage, or the like due to simultaneous operation of a number of current sources.

Further, since an area of the photoelectric conversion element in the first substrate 20 can increase as compared to a case in which all circuit elements of pixels are arranged in one substrate, sensitivity is improved. Further, as the analog memories are used, an area of a region for signal accumulation provided in the second substrate 21 can decrease.

Further, it is possible to reduce deterioration of signal quality by providing the analog memories 231, 232, 233, and 234. In particular, the signal charges held in the analog memory are more than those held in the charge holding unit because a capacitance value of the analog memory is made greater than that of the charge holding unit. For example, as the capacitance value of the analog memory is five or more times the capacitance value of the charge holding unit, the signal charges held in the analog memory are more than those held in the charge holding unit. Accordingly, it is possible to reduce influence of signal deterioration due to leak current of the analog memory.

It is also possible to reduce influence of a noise generated in the first substrate 20 by providing the clamp capacitor 260 and the second transfer transistors 271, 272, 273 and 274. The noise generated in the first substrate 20 includes a noise (e.g., a reset noise) originating from operation of the circuit (e.g., the first reset transistor 220) connected to the first amplification transistor 240 and generated in the input part of the first amplification transistor 240, or the like. Further, the noise generated in the first substrate 20 includes a noise originating from an operation property of the first amplification transistor 240 (e.g., a noise due to a variation of a circuit threshold of the first amplification transistor 240) or the like.

Further, a variation occurs in the output of the first amplification transistor 240 due to signals when the analog memories 231, 232, 233, and 234 are reset and transfer of the signal charges from the photoelectric conversion elements 201, 202, 203 and 204 to the charge holding unit 230. It is possible to reduce influence of a noise generated in the second substrate 21 by outputting a signal according to this variation from the pixel 100 in time division and performing differential processing on each signal in the outside of the pixel 100. The noise generated in the second substrate 21 includes a noise (e.g., a reset noise) originating from operation of the circuits connected to the second amplification transistors 241, 242, 243 and 244 and generated in the input part of the second amplification transistors 241, 242, 243 and 244, or the like. The circuits connected to the second amplification transistors 241, 242, 243 and 244 are, for example, the second reset transistors 221, 222, 223 and 224.

Second Embodiment

Next, a second embodiment of the present invention will be described. A configuration of the solid-state imaging device in the present embodiment is the same as the configuration described in the first embodiment except that the position of the connection part 250 in the pixel cell differs. Hereinafter, parts different from those in the first embodiment will be described.

Hereinafter, the arrangement position of the connection part 250 with respect to the array of the pixels 100A in the first substrate 20 will be described, but the same applies to the arrangement position of the connection part 250 with respect to the array of the pixels 100B in the second substrate 21.

FIGS. 9A to 9E illustrate arrangement positions of the connection part 250 with respect to the array of the pixels 100A in the first substrate 20. FIGS. 9A to 9E illustrate states in which pixels 100A are viewed from a direction perpendicular to a surface of the pixel portion 200. Each of a pixel cell 140A illustrated in FIG. 9A and a pixel cell 140B illustrated in FIG. 9B includes four pixels 100A which are continuously arranged in a vertical direction and whose horizontal positions (column positions) are the same and vertical positions (row positions) differ within the surface of the pixel portion 200. Further, each of a pixel cell 140C illustrated in FIG. 9C and a pixel cell 140D illustrated in FIG. 9D includes four pixels 100A which are continuously arranged in a vertical direction and whose horizontal positions (column positions) are the same and vertical positions (row positions) differ within the surface of the pixel portion 200. All the pixels 100 in the pixel portion 200 are classified into any one of the pixel cells 140A, 140B, 140C, and 140D.

A connection part 250A corresponding to the pixel cell 140A is formed to be across the pixel 100A at the top within the pixel cell 140A. A connection part 250B corresponding to the pixel cell 140B is formed to be across the second pixel 100A from the bottom within the pixel cell 140B. A connection part 250C corresponding to the pixel cell 140C is formed to be across the second pixel 100A from the top within the pixel cell 140C. A connection part 250D corresponding to the pixel cell 140D is formed to be across the pixel 100A at the bottom within the pixel cell 140D.

As illustrated in FIG. 9E, the pixel cell 140A and the pixel cell 140B are arranged to be adjacent in a horizontal direction in the pixel portion 200. A position of the connection part 250A corresponding to the pixel cell 140A and a position of the connection part 250B corresponding to the pixel cell 140B are determined in advance so that a positional relationship therebetween is such a predetermined positional relationship that a clearance between the connection part 250A and the connection part 250B can be sufficiently secured. The position of the connection part 250A may be rephrased with a position of the connection region 101 for connection with the connection part 250A. The position of the connection part 250B may be rephrased with a position of the connection region 101 for connection with the connection part 250B.

Similarly, as illustrated in FIG. 9E, the pixel cell 140C and the pixel cell 140D are arranged to be adjacent in the horizontal direction in the pixel portion 200. A position of the connection part 250C corresponding to the pixel cell 140C and a position of the connection part 250D corresponding to the pixel cell 140D are determined in advance so that a positional relationship therebetween is such a predetermined positional relationship that a clearance between the connection part 250C and the connection part 250D can be sufficiently secured. The position of the connection part 250C may be rephrased with a position of the connection region 101 for connection with the connection part 250C. The position of the connection part 250D may be rephrased with a position of the connection region 101 for connection with the connection part 250D.

The position of the connection part 250A corresponding to the pixel cell 140A and the position of the connection part 250C corresponding to the pixel cell 140C are determined in advance so that a positional relationship therebetween is such a predetermined positional relationship that a clearance between the connection part 250A and the connection part 250C can be sufficiently secured. The position of the connection part 250B corresponding to the pixel cell 140B and the position of the connection part 250C corresponding to the pixel cell 140C are determined in advance so that a positional relationship therebetween is such a predetermined positional relationship that a clearance between the connection part 250B and the connection part 250C can be sufficiently secured. The position of the connection part 250B corresponding to the pixel cell 140B and the position of the connection part 250D corresponding to the pixel cell 140D are determined in advance so that a positional relationship therebetween is such a predetermined positional relationship that a clearance between the connection part 250B and the connection part 250D can be sufficiently secured.

For example, the position of the connection part 250A is determined as a predetermined position in a region of a combination of the pixel cells 140A and 140B. The position of the connection part 250B is determined as a position having a predetermined geometric relationship with the position of the connection part 250A according to the position of the connection part 250B in the region of the combination of the pixel cells 140A and 140B. Further, the position of the connection part 250C is determined as a position having a predetermined geometric relationship with the positions of the connection parts 250A and 250B according to the positions of the connection parts 250A and 250B in the region of the combination of the pixel cells 140C and 140D. Further, the position of the connection part 250D is determined as a position having a predetermined geometric relationship with the positions of the connection parts 250B and 250C according to the positions of the connection parts 250B and 250C in the region of the combination of the pixel cells 140C and 140D.

In an example illustrated in FIG. 9E, the position of the connection part 250A is determined as a center position of the pixel 100A at the top within the pixel cell 140A and the pixel 100A at the top within the pixel cell 140B. The position of the connection part 250B is determined as a center position of the second pixel 100A from the bottom within the pixel cell 140A and the second pixel 100A from the bottom within the pixel cell 140B. Accordingly, the connection part 250A is formed to be across the pixel 100A at the top within the pixel cell 140A and the pixel 100A at the top within the pixel cell 140B. The connection part 250B is formed to be across the second pixel 100A from the bottom within the pixel cell 140A and the second pixel 100A from the bottom within the pixel cell 140B.

Further, in the example illustrated in FIG. 9E, the position of the connection part 250C is determined as a center position of the second pixel 100A from the top within the pixel cell 140C and the second pixel 100A from the top within the pixel cell 140D. The position of the connection part 250D is determined as a center position of the pixel 100A at the bottom within the pixel cell 140C and the pixel 100A at the bottom within the pixel cell 140D. Accordingly, the connection part 250C is formed to be across the second pixel 100A from the top within the pixel cell 140C and the second pixel 100A from the top within the pixel cell 140D. The connection part 250D is formed to be across the pixel 100A at the bottom within the pixel cell 140C and the pixel 100A at the bottom within the pixel cell 140D.

In the example illustrated in FIG. 9E, the connection parts 250A, 250B, 250C, and 250D are distributed and arranged so that a distance between the connection parts is equal to or larger than a predetermined distance in a region of a combination of the pixel cells 140A, 140B, 140C and 140D. Further, the connection parts 250A and 250D are in symmetrical positions with respect to a center point P2 of the region of the combination of the pixel cells 140A, 140B, 140C and 140D. Similarly, the connection parts 250B and 250C are in symmetrical positions with respect to the center point P2. As the connection parts 250A and 250B are formed to be across the adjacent pixel cells 140A and 140B and the connection parts 250C and 250D are formed to be across the adjacent pixel cells 140C and 140D, the following effects can be obtained. That is, the effect that the connection parts 250A, 250B, 250C, and 250D can be distributed and arranged within the region of the combination of the pixel cells 140A, 140B, 140C and 140D can be obtained.

Figure 10:
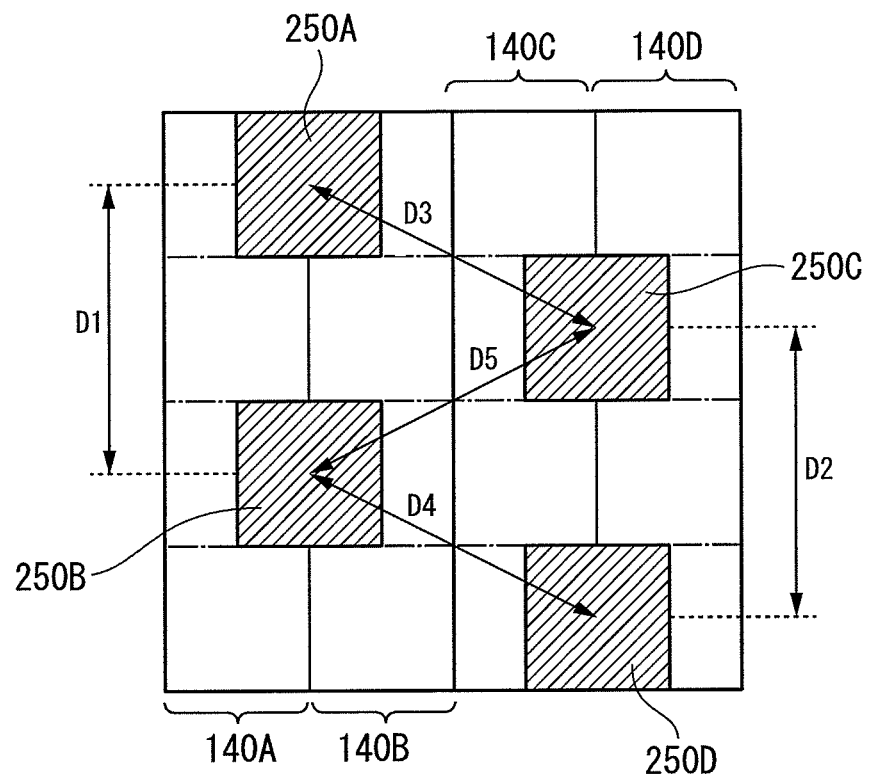
FIG. 10 is a schematic diagram illustrating an arrangement of the connection part included in the solid-state imaging device according to the second embodiment of the present invention.
Figure 11A:
FIG. 11A is a cross-sectional view of a solid-state imaging device of related art.
Figure 11B:
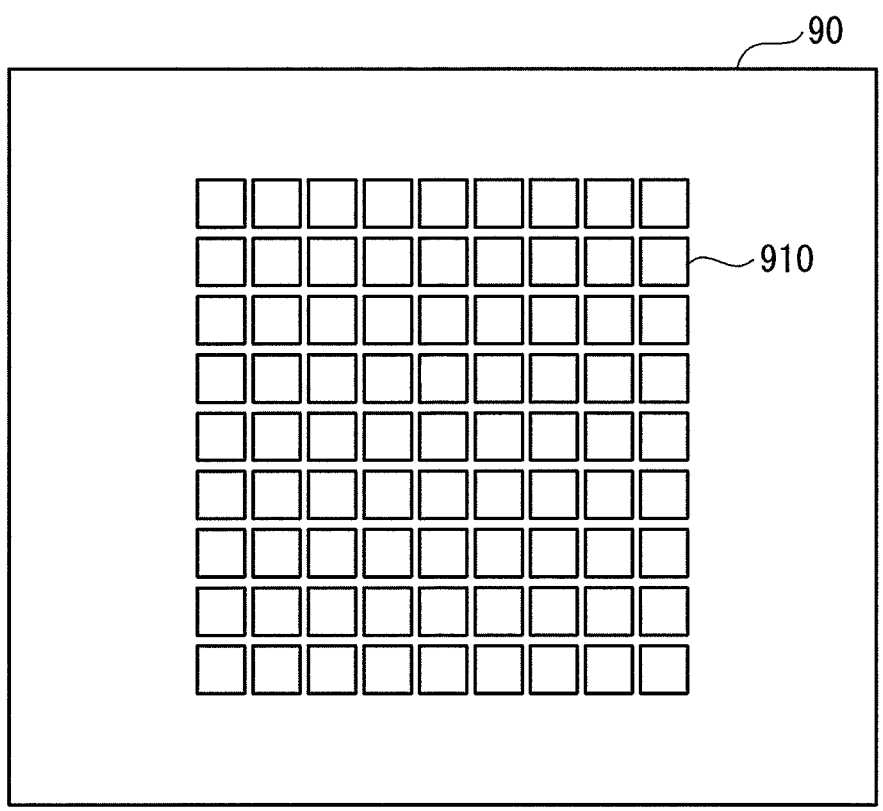
FIG. 11B is a plan view of the solid-state imaging device of the related art.
Figure 12:
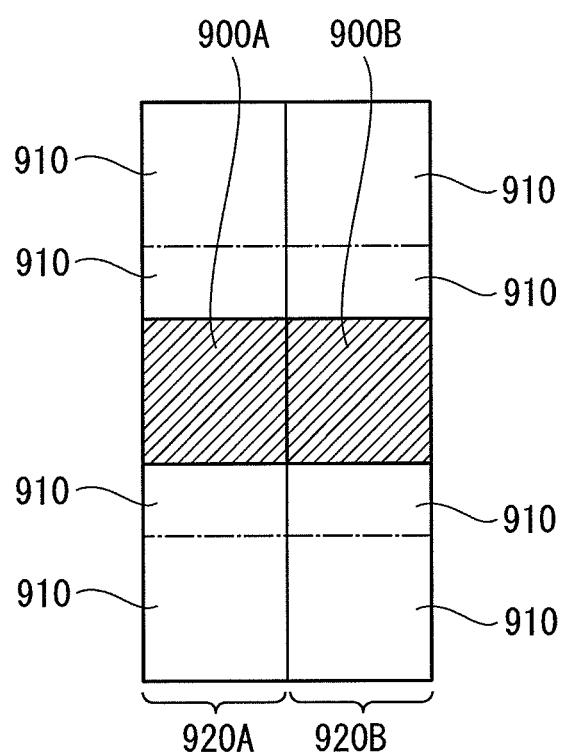
FIG. 12 is a schematic diagram illustrating a position of a connection part in a pixel cell.

It is desirable for distances in a predetermined direction between the connection parts 250A, 250B, 250C, and 250D to be equal distances in order to make the distances between all the connection parts greater. More specifically, as illustrated in FIG. 10, a distance D1 between connection parts 250A and 250B in a direction parallel to a reference axis $\alpha 1$ (a vertical direction) is equal to a distance D2 between connection parts 250C and 250D in the direction parallel to the reference axis $\alpha 1$ (the vertical direction). Similarly, a distance D3 between connection parts 250A and 250C in a direction parallel to a reference axis $a2$ is equal to a distance D4 between the connection parts 250B and 250D in the direction parallel to the reference axis $a2$. Further, a distance D5 between the connection parts 250B and 250C is also equal to the distances D3 and D4.

In a state in which the pixel cells 140A, 140B, 140C and 140D are arranged as illustrated in FIG. 9E, a sufficient clearance between the respective connection parts can be secured. The pixel portion 200 is configured by arranging pixel units each including the pixel cells 140A, 140B, 140C and 140D in a two-dimensional direction.

As the four pixel cells in which the positions of the connection parts 250 within the pixel cells differ are combined to constitute one pixel unit and the pixel portion 200 includes the pixel units as described above, the following effects can be obtained. That is, an effect that the respective connection parts 250 can be arranged in the farthest positions can be obtained. As a result, even when the pixel cell includes a plurality of pixels 100 arranged in a vertical direction within the surface of the pixel portion 200, a clearance between the connection parts 250 both in the vertical direction and in the horizontal direction within the surface of the pixel portion 200 can be secured. In the present embodiment, the clearance in the horizontal direction between the connection parts 250 can be made wider than that in the first embodiment.

In the present embodiment, the pixel cell includes the four pixels 100 continuously arranged in the vertical direction, but the present invention is not limited thereto and it is understood that variations may be made to the invention without departing from the object. Further, the pixel cell may include a plurality of pixels 100 arranged in the horizontal direction as long as it can correspond to increase in the number of signal lines.

As described above, according to the present embodiment, since the connection region connected with the connection part corresponding to any pixel cell is in a position according to the position of the connection region connected with the connection part corresponding to the other pixel cell, the clearance between the connection parts can be secured. Further, as the connection region of one pixel cell among the adjacent pixel cells and the connection region of the other pixel cell have a predetermined positional relationship, the clearance between the connection parts in the adjacent pixel cells can be secured. In the present embodiment, the clearance between the connection parts within the pixel unit including four pixel cells can be secured. Further, as the distances in the predetermined direction between the connection parts within one pixel unit are equal distances, it is possible to make the clearance between the connection parts greater.

The same effect of reducing a chip area or an effect of reducing influence of a noise, which is not due to the position of the connection part within the pixel cell, can be obtained as in the first embodiment.

Output circuits according to an embodiment of the present invention correspond to, for example, the selection transistors 291, 292, 293, and 294. Signal accumulation circuits according to an embodiment of the present invention correspond to, for example, the analog memories 231, 232, 233, and 234. A control circuit according to an embodiment of the present invention corresponds to, for example, the vertical scanning circuit 300. An amplification circuit (an amplification transistor) according to an embodiment of the present invention corresponds to, for example, the first amplification transistor

240. A noise reduction circuit according to an embodiment of the present invention corresponds to, for example, the clamp capacitor 260 and the second transfer transistors 271, 272, 273 and 274 (transistors). Transfer circuits according to an embodiment of the present invention correspond to, for example, the first transfer transistors 211, 212, 213 and 214.

While the embodiments of the present invention have been described above in detail with reference to the drawings, a concrete configuration is not limited to the above embodiments, and a design change is included without departing from the scope and spirit of the present invention. In the above description, the configuration of the solid-state imaging device in which the two substrates are connected by the connection part is shown. However, three or more substrates may be connected by the connection part. In the case of a solid-state imaging device in which the three or more substrates are connected by the connection part, two of the three or more substrates correspond to the first substrate and the second substrate.

For example, a solid-state imaging device according to one aspect of the present invention is as follows:

"A solid-state imaging device including:
a plurality of pixels;
a first substrate and a second substrate in which circuit elements of the plurality of pixels are arranged, and
connection parts that electrically connect the first substrate with the second substrate,
wherein each of the plurality of pixels includes:
a photoelectric conversion means included in the first substrate; and
an output means that outputs, from the pixel, a signal that is generated by the photoelectric conversion means and is via the connection part, the output means being included in the second substrate, and
wherein, in the first substrate, a region in which the plurality of pixels are arranged includes a plurality of pixel cells each including a plurality of pixels, and the connection parts are provided to correspond to the pixel cells, and
a first connection region connected with the connection part corresponding to any one of the plurality of pixel cells is in a position according to a position of a second connection region connected with the connection part corresponding to the other pixel cell."

For example, an imaging apparatus according to one aspect of the present invention is as follows:

"An imaging apparatus including:
a plurality of pixels;
a first substrate and a second substrate in which circuit elements of the plurality of pixels are arranged, and
connection parts that electrically connect the first substrate with the second substrate,
wherein each of the plurality of pixels includes:
a photoelectric conversion means included in the first substrate; and
an output means that outputs, from the pixel, a signal that is generated by the photoelectric conversion means and is via the connection part, the output circuit being included in the second substrate, and
wherein, in the first substrate, a region in which the plurality of pixels are arranged includes a plurality of pixel cells each including a plurality of pixels, and the connection parts are provided to correspond to the pixel cells, and
a first connection region connected with the connection part corresponding to any one of the plurality of pixel cells is in a position according to a position of a second connection region connected with the connection part corresponding to the other pixel cell."

A computer program product for realizing any combination of the components or the processes described above is also valid as an aspect of the present invention. The computer program product refers to a recording medium, an apparatus, a device, or a system in which program code has been incorporated, such as a recording medium having program code recorded thereon, a computer having program code recorded thereon, and an Internet system having program code recorded thereon. The recording medium having program code recorded thereon is a DVD medium, a hard disk medium, a memory medium, or the like. The Internet system having program code recorded thereon is, for example, a system including a server and a client terminal. In this case, the above-described components or processes are mounted in modules, and program code including the mounted modules is recorded in the computer program product.

For example, a computer program product according to one aspect of the present invention is as follows:

"A computer program product in which program codes are recorded, the program codes including:
a first module that generates a signal that is generated by a photoelectric conversion element included n a first substrate in which circuit elements of a plurality of pixels are arranged; and
a second module that outputs, from the plurality of pixels via an output circuit included in a second substrate, a signal that is generated by the photoelectric conversion element and is via a connection part that is electrically connects the first substrate and the second substrate."

A program for realizing any combination of the components or the processes according to the above-described embodiment is also valid as an aspect of the present invention. The object of the present invention can be achieved by recording the program in a computer-readable recording medium and reading and executing the program recorded in the recording medium by a computer.

Here, the "computer" also includes a homepage providing environment (or a display environment) when using a WWW system. Also, the "computer-readable recording medium" includes a portable medium such as a flexible disk, a magnetic optical disc, a ROM, or CD-ROM, and a storage device such as a hard disk embedded in a computer. Also, the "computer-readable recording medium" includes a medium that holds a program for a predetermined time. The "computer-readable recording medium" is a volatile memory (RAM) in a computer system consisting of a server and a client when a program is transmitted via a network such as the Internet or a communication line such as telephone line.

Further, the above-described program may be transmitted from a computer in which the program is stored in a storage device, etc. to other computers via a transmission medium or by transmission waves in the transmission medium. Here, the "transmission medium" for transmitting the program refers to a medium having a function of transmitting information, such as a network (communication network) such as the Internet or a communication line such as a telephone line. Also, the above-described program may be a program for realizing some of the above-described functions. Alternatively, the program may be a program capable of realizing the above-described functions through a combination with a program previously stored in a computer system, i.e., a differential file (a differential program).

While the preferred embodiments of the present invention have been described above, various alternatives, variations, and equivalents may be used as each component or each process described above. In the embodiments disclosed in the present disclosure, one part may be substituted with a plurality of parts or a plurality of parts may be substituted with one part to execute one or a plurality of functions. Such substitutions fall in a range of the present invention unless the substitutions do not appropriately act in order to achieve the object of the present invention. Accordingly, the range of the present invention is not determined with reference to the above description, but may be determined by claims, including an entire scope of equivalents. In the claims, each component includes one or more components, unless explicitly stated otherwise. It should not be construed that the claims include means-plus-function limitations unless explicitly described using phrases such as "means for" in the claims.

The terminology used in the present disclosure is for the purpose of describing particular embodiments only and is not intended to be limiting of the present invention. In this disclosure, the singular forms "a," "an" and "the" are intended to include the plural forms as well, unless the context clearly indicates otherwise.

What is claimed is:

1. A solid-state imaging device comprising:
    a plurality of pixels;
    a first substrate and a second substrate in which circuit elements of the plurality of pixels are arranged, and
    connection parts that electrically connect the first substrate with the second substrate,
    wherein each of the plurality of pixels comprises:
    a photoelectric conversion element comprised in the first substrate; and
    an output circuit that outputs, from the pixel, a signal that is generated by the photoelectric conversion element and is via the connection part, the output circuit being comprised in the second substrate, and
    wherein, in the first substrate, a region in which the plurality of pixels are arranged comprises a plurality of pixel cells each comprising a plurality of pixels, and the connection parts are provided to correspond to the pixel cells, and
    a first connection region connected with the connection part corresponding to any one of the plurality of pixel cells is in a position according to a position of a second connection region connected with the connection part corresponding to the other pixel cell.

2. The solid-state imaging device according to claim 1, wherein:
    the first connection region connected with the connection part corresponding to any one of the plurality of pixel cells is in a position according to the position of the second connection region connected with the connection part corresponding to the other pixel cell adjacent to any one of the plurality of pixel cells.

3. The solid-state imaging device according to claim 2, wherein the first connection region and the second connection region are across any one of the plurality of pixel cells and the other pixel cell adjacent to the pixel cell.

4. The solid-state imaging device according to claim 1, wherein the plurality of pixel cells comprise n pixels (n is an integer equal to or greater than 2) adjacent in a vertical direction or a horizontal direction within a surface in which the plurality of pixels are arranged.

5. The solid-state imaging device according to claim 1, wherein distances between the connection regions within a unit comprising n pixel cells (n is an integer equal to or greater than 2) among the plurality of pixel cells are equal distances.

6. The solid-state imaging device according to claim 5, wherein distances between the connection regions adjacent in a predetermined direction within the unit are equal distances.

7. The solid-state imaging device according to claim 5, wherein the unit comprises the plurality of n pixel cells continuously arranged in a predetermined direction.

8. The solid-state imaging device according to claim 5, wherein the unit comprises two of the plurality of pixel cells.

9. The solid-state imaging device according to claim 5, wherein the unit comprises four of the plurality of pixel cells.

10. The solid-state imaging device according to claim 5, wherein:
    the plurality of pixels are arranged in a matrix shape,
    the pixel cell comprises the plurality of pixels continuous in a vertical direction or a horizontal direction within a surface in which the plurality of pixels are arranged, and
    the unit has a rectangular shape.

11. The solid-state imaging device according to claim 1, wherein:
    each of the plurality of pixels further comprises a signal accumulation circuit that accumulates a signal that is generated by the photoelectric conversion element and is via the connection part, the signal accumulation circuit being comprised in the second substrate, and
    the output circuit outputs, from the plurality of pixels, the signals accumulated in the signal accumulation circuits.

12. The solid-state imaging device according to claim 11, wherein:
    all of the plurality of pixels are classified into a plurality of groups in units of a single row or a plurality of rows in an array of the plurality of pixels, and
    the device further comprises a control circuit that performs control to collectively select the plurality of groups, sequentially accumulate signals generated by the photoelectric conversion elements of the plurality of pixels in the selected groups in the signal accumulation circuits, sequentially select any one group from the plurality of groups, and sequentially output signals accumulated in the signal accumulation circuits corresponding to the plurality of pixels in the selected group, from the plurality of pixels via the output circuits.

13. The solid-state imaging device according to claim 11, wherein:
    the plurality of pixels further comprise an amplification circuit that amplifies a signal generated by the photoelectric conversion element and outputs an amplification signal, and
    the signal accumulation circuit accumulates the amplification signal output from the amplification circuit.

14. The solid-state imaging device according to claim 13, further comprising:
    a noise reduction circuit that reduces a noise in the amplification signal output from the amplification circuit,
    wherein the signal accumulation circuit accumulates the amplification signal in which the noise has been reduced by the noise reduction circuit.

15. The solid-state imaging device according to claim 14, wherein the amplification circuit comprises an amplification transistor that receives the signal generated by the photoelectric conversion element using a gate, amplifies the signal received using the gate, and outputs the amplification signal from one of a source and a drain.

16. The solid-state imaging device according to claim 15, wherein the noise reduction circuit comprises:
    a clamp capacitor that clamps the amplification signal output from the amplification transistor; and
    a transistor that receives a signal according to the amplification signal clamped by the clamp capacitor using one of a source and a drain, samples and holds the signal received using the one of the source and drain, and accumulates the resultant signal in the signal accumulation circuit.

17. The solid-state imaging device according to claim 16, further comprising:
a transfer circuit that transfers the signal generated by the photoelectric conversion element to an input part of the amplification circuit,
wherein the connection part is arranged between the transfer circuit and the amplification transistor, between the amplification transistor and the clamp capacitor, or between the clamp capacitor and the transistor in an electrically connected path from the transfer circuit to the transistor.

18. The solid-state imaging device according to claim 1, wherein the second substrate is connected with a surface opposite to a surface of the first substrate irradiated with light incident on the photoelectric conversion element.

19. An imaging apparatus comprising:
a plurality of pixels;
a first substrate and a second substrate in which circuit elements of the plurality of pixels are arranged, and
connection parts that electrically connect the first substrate with the second substrate,
wherein each of the plurality of pixels comprises:
a photoelectric conversion element comprised in the first substrate; and
an output circuit that outputs, from the pixel, a signal that is generated by the photoelectric conversion element and is via the connection part, the output circuit being comprised in the second substrate, and
wherein, in the first substrate, a region in which the plurality of pixels are arranged comprises a plurality of pixel cells each comprising a plurality of pixels, and the connection parts are provided to correspond to the pixel cells, and
a first connection region connected with the connection part corresponding to any one of the plurality of pixel cells is in a position according to a position of a second connection region connected with the connection part corresponding to the other pixel cell.

* * * * *